US009449913B2

(12) United States Patent
Lee et al.

(10) Patent No.: US 9,449,913 B2
(45) Date of Patent: Sep. 20, 2016

(54) 3D INTERCONNECT STRUCTURE COMPRISING FINE PITCH SINGLE DAMASCENE BACKSIDE METAL REDISTRIBUTION LINES COMBINED WITH THROUGH-SILICON VIAS

(75) Inventors: Kevin J. Lee, Beaverton, OR (US); Mark T. Bohr, Aloha, OR (US); Andrew W. Yeoh, Portland, OR (US); Christopher M. Pelto, Beaverton, OR (US); Hiten Kothari, Beaverton, OR (US); Seshu V. Sattiraju, Portland, OR (US); Hang-Shing Ma, Portland, OR (US)

(73) Assignee: Intel Corporation, Santa Clara, CA (US)

(*) Notice: Subject to any disclaimer, the term of this patent is extended or adjusted under 35 U.S.C. 154(b) by 265 days.

(21) Appl. No.: 13/994,668

(22) PCT Filed: Oct. 28, 2011

(86) PCT No.: PCT/US2011/058429
§ 371 (c)(1),
(2), (4) Date: Jun. 14, 2013

(87) PCT Pub. No.: WO2013/062593
PCT Pub. Date: May 2, 2013

(65) Prior Publication Data
US 2013/0256910 A1    Oct. 3, 2013

(51) Int. Cl.
*H01L 23/48* (2006.01)
*H01L 23/522* (2006.01)
(Continued)

(52) U.S. Cl.
CPC ..... *H01L 23/5226* (2013.01); *H01L 21/76802* (2013.01); *H01L 21/76898* (2013.01); *H01L 23/291* (2013.01); *H01L 24/03* (2013.01); *H01L 24/05* (2013.01); *H01L 24/06* (2013.01);
(Continued)

(58) Field of Classification Search
CPC .................................................... H01L 23/48
See application file for complete search history.

(56) References Cited

U.S. PATENT DOCUMENTS 6,551,856 B1    4/2003    Lee
8,791,549 B2    7/2014    Chen et al.
(Continued)

FOREIGN PATENT DOCUMENTS

CN    101794717 A    8/2010
CN    102024781 A    4/2011
(Continued)

OTHER PUBLICATIONS

Preliminary Examination Decision of Rejection from the Intellectual Property Office (IP Office) dated Dec. 2, 2014, Taiwan Patent Application No. 101133495 (12 pages) and English Translation thereof (8 pages).
(Continued)

*Primary Examiner* — William Harriston
(74) *Attorney, Agent, or Firm* — Blakely, Sokoloff, Taylor & Zafman LLP

(57) ABSTRACT

A 3D interconnect structure and method of manufacture are described in which metal redistribution layers (RDLs) are integrated with through-silicon vias (TSVs) and using a single damascene type process flow. A silicon nitride or silicon carbide passivation layer may be provided between the thinned device wafer back side and the RDLs to provide a hermetic barrier and polish stop layer during the process flow.

22 Claims, 29 Drawing Sheets

(51) Int. Cl.
*H01L 21/768* (2006.01)
*H01L 23/29* (2006.01)
*H01L 23/00* (2006.01)

(52) U.S. Cl.
CPC ............... *H01L24/13* (2013.01); *H01L 24/11* (2013.01); *H01L 2224/02372* (2013.01); *H01L 2224/02379* (2013.01); *H01L 2224/0401* (2013.01); *H01L 2224/05548* (2013.01); *H01L 2224/05567* (2013.01); *H01L 2224/05568* (2013.01); *H01L 2224/05624* (2013.01); *H01L 2224/05647* (2013.01); *H01L 2224/06131* (2013.01); *H01L 2224/06181* (2013.01); *H01L 2224/1146* (2013.01); *H01L 2224/11334* (2013.01); *H01L 2224/11823* (2013.01); *H01L 2224/11825* (2013.01); *H01L 2224/13022* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/13562* (2013.01); *H01L 2224/13582* (2013.01); *H01L 2224/13583* (2013.01); *H01L 2224/13611* (2013.01); *H01L 2224/13644* (2013.01); *H01L 2224/13655* (2013.01); *H01L 2224/13657* (2013.01); *H01L 2224/16145* (2013.01); *H01L 2224/16225* (2013.01); *H01L 2224/16227* (2013.01); *H01L 2224/94* (2013.01); *H01L 2924/00014* (2013.01); *H01L 2924/1306* (2013.01); *H01L 2924/13091* (2013.01); *H01L 2924/1461* (2013.01)

(56) References Cited

U.S. PATENT DOCUMENTS

| 2002/0084513 | A1 | 7/2002 | Siniaguine |
| 2006/0180941 | A1 | 8/2006 | Kirby |
| 2010/0178761 | A1* | 7/2010 | Chen ............... H01L 21/76898 438/613 |
| 2010/0219526 | A1 | 9/2010 | Stapleton et al. |
| 2011/0068466 | A1 | 3/2011 | Chen et al. |
| 2013/0009317 | A1* | 1/2013 | Hsieh et al. .................. 257/774 |

FOREIGN PATENT DOCUMENTS

| JP | 2010-219526 | 9/2010 |
| TW | 201112371 A | 4/2011 |

OTHER PUBLICATIONS

PCT International Search Report and Written Opinion for International Application No. PCT/US2011/058429, mailed Jul. 18, 2012, 10 pages.

Notice of Preliminary Rejection (Non-Final) from Korean Intellectual Property Office (KIPO) mailed Sep. 3, 2015 for Korean Patent Application No. 10-2014-7011201 and English Summary thereof.

First Office Action from Chinese Patent Office dated Jan. 4, 2016 for Chinese Patent Application No. 201180074419.6.

Second Office Action from Chhinese Intellectual Property Office dated Jul. 5, 2016 for Chinese Patent Application No. 201180074419.6.

\* cited by examiner

3D INTERCONNECT STRUCTURE COMPRISING FINE PITCH SINGLE DAMASCENE BACKSIDE METAL REDISTRIBUTION LINES COMBINED WITH THROUGH-SILICON VIAS

CROSS-REFERENCE TO RELATED APPLICATION

This patent application is a U.S. National Phase application under 35 U.S.C. §371 of International Application No. PCT/US2011/058429, filed Oct. 28, 2011, entitled 3D INTERCONNECT STRUCTURE COMPRISING FINE PITCH SINGLE DAMASCENE BACKSIDE METAL REDISTRIBUTION LINES COMBINED WITH THROUGH-SILICON VIAS.

BACKGROUND OF THE INVENTION

1. Field of the Invention

The present invention relates to three dimensional (3D) packaging, and more particularly to the integration of through-silicon vias (TSVs) into 3D packages.

2. Discussion of Related Art 3D packaging is emerging as a solution for microelectronics development toward system on chip (SOC) and system in package (SIP). In particular, 3D flip chip structures with TSVs have the potential for being widely adopted. TSV 3D packages generally contain two or more chips stacked vertically, with vias through silicon substrates replacing edge wiring to create an electrical connection between the circuit elements on each chip.

The Joint Electron Devices Engineering Council (JEDEC) is currently developing a WideIO standard defining the chip-to-chip landing pad interface for a logic-to-memory interface. Conventionally, the physical locations of TSVs are located directly beneath the landing pad locations on a chip, which takes up a lot of real estate. This means that all other circuitry is laid out around the TSV locations.

During TSV processing, the array of TSVs are formed through a thinned device wafer. Conventional TSV structures use either silicon dioxide or polymers as an insulator material on the backside of the thinned device wafer. These materials are not hermetic, and do not provide a robust passivation layer on the backside of the thinned device wafer.

DETAILED DESCRIPTION OF THE PRESENT INVENTION

Figure 1:
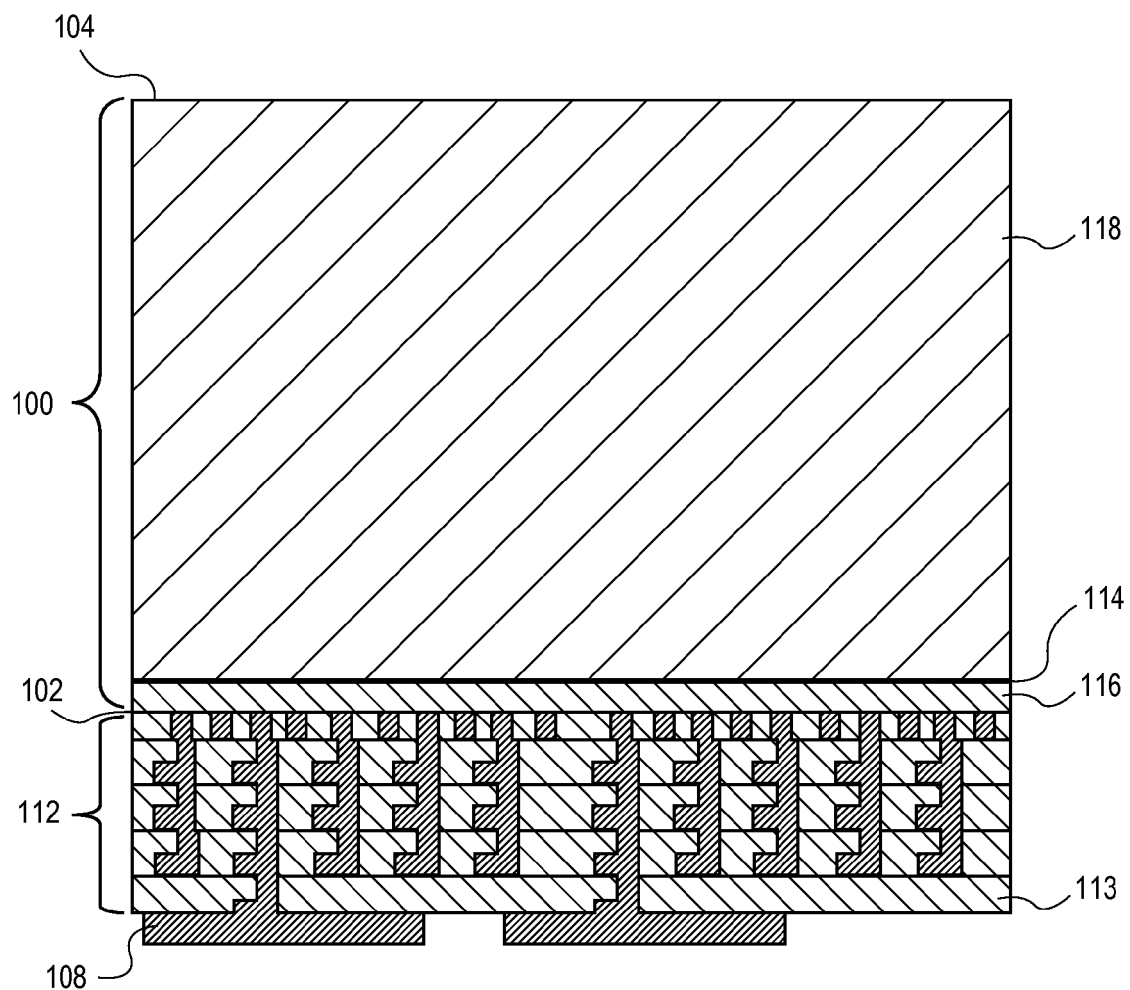
FIGS. 1-25 are a cross-sectional side view illustrations of method of manufacturing a 3D interconnect structure using single damascene processing in accordance with embodiments of the invention.

In various embodiments, a 3D interconnect structure and method of manufacturing a 3D interconnect structure is described. However, certain embodiments may be practiced without one or more of these specific details, or in combination with other known methods and materials. In the following description, numerous specific details are set forth, such as specific materials and processes, etc. in order to provide a thorough understanding of the present invention. In other instances, well-known packaging processes and manufacturing techniques have not been described in particular detail in order to not unnecessarily obscure the present invention. Reference throughout this specification to "an embodiment" or "one embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

The terms "over", "to", "between" and "on" as used herein may refer to a relative position of one layer with respect to other layers. One layer "over" another layer or bonded "to" another layer may be directly in contact with the other layer or may have one or more intervening layers. One layer "between" layers may be directly in contact with the layers or may have one or more intervening layers. In contrast, a first layer "on" a second layer is in contact with that second layer.

In one aspect, embodiments of the invention describe a 3D interconnect structure and process which combines through-silicon vias (TSVs) with very fine pitch single damascene type backside metal redistribution layers (RDLs). This particular combination may allow for the physical locations of the TSVs to be decoupled from the chip-to-chip landing pad locations, thus providing greater circuit layout flexibility. In this manner multiple traces can be run between adjacent landing pad rows or columns. For example, multiple traces may run between adjacent landing pad rows or columns separated by a pitch of 10 µm-500 µm. Embodiments of the invention may allow for a hermetically sealed 3D interconnect structure and a finer pitch RDL architecture than can be accomplished with a plate through resist method, and allow the use of copper metal which is not possible with subtractive etching processes for producing aluminum RDL lines.

In another aspect, embodiments of the invention describe a silicon nitride or silicon carbide passivation layer which separates the backside RDLs from the bulk semiconductor (e.g. silicon) of the thinned device wafer. The silicon nitride or silicon carbide passivation layer may provide a hermetic barrier that protects the backside of the thinned device wafer from trace metal and moisture contamination during TSV and RDL processing. In addition, the backside passivation layer material is useful in the single damascene process in that the passivation layer material can also act as an etch stop layer during oxide trench etching to form the backside RDLs, which allows the oxide trench etching to incorporate a large amount of over-etch without causing a significant amount of the passivation layer to also be removed during single damascene processing. Furthermore, the backside passivation layer materials such as silicon nitride or silicon carbide may have significantly lower removal rates than the TSV barrier layer materials such as tantalum (Ta), titanium (Ti), tantalum nitride (TaN) or titanium nitride (TiN), so that the passivation layer allows for a large amount of overpolish to be incorporated into a TSV barrier layer chemical mechanical polish (CMP) step without also causing a significant amount of the passivation layer to be removed. Common commercially available barrier layer CMP slurries engineered for the removal of barrier materials such as Ta, Ti, TaN, TiN are also engineered to remove oxides such as silicon dioxide. Thus, in some embodiments, a passivation layer formed of silicon nitride or silicon carbide may be utilized as a polish stop layer when removing the TSV barrier layer between TSVs, thereby protecting the integrity of the TSV structure.

Accordingly, embodiments of the present invention describe a manner of integrating single damascene RDL processing with a TSV structure in which the single damascene processing may allow for the formation of very fine pitch backside RDLs and greater circuit layout flexibility, while integrating a hermetic barrier passivation layer into the processing sequence which may act as a CMP stop layer during TSV barrier layer removal from between TSVs, act as an etch stop layer during RDL trench etching, and provide enhanced reliability performance of the device. It is to be understood that while embodiments are described with reference to TSV processing of a silicon device wafer, the embodiments are also applicable to substrates other than silicon wafers, such as compound III-V wafers or II-VI wafers. In addition, it is to be appreciated that while "via last" TSV processing (vias made after metallization structure) is described and illustrated in detail, that embodiments of the invention are not so limited, and that embodiments of the invention may also compatible with "via first" TSV processing (vias made before microelectronic device is formed) and "via middle" TSV processing (vias made between forming microelectronic device and metallization structure). For example, single damascene RDL processing may also be integrated into via first and via middle TSV processing sequences.

Figure 25:
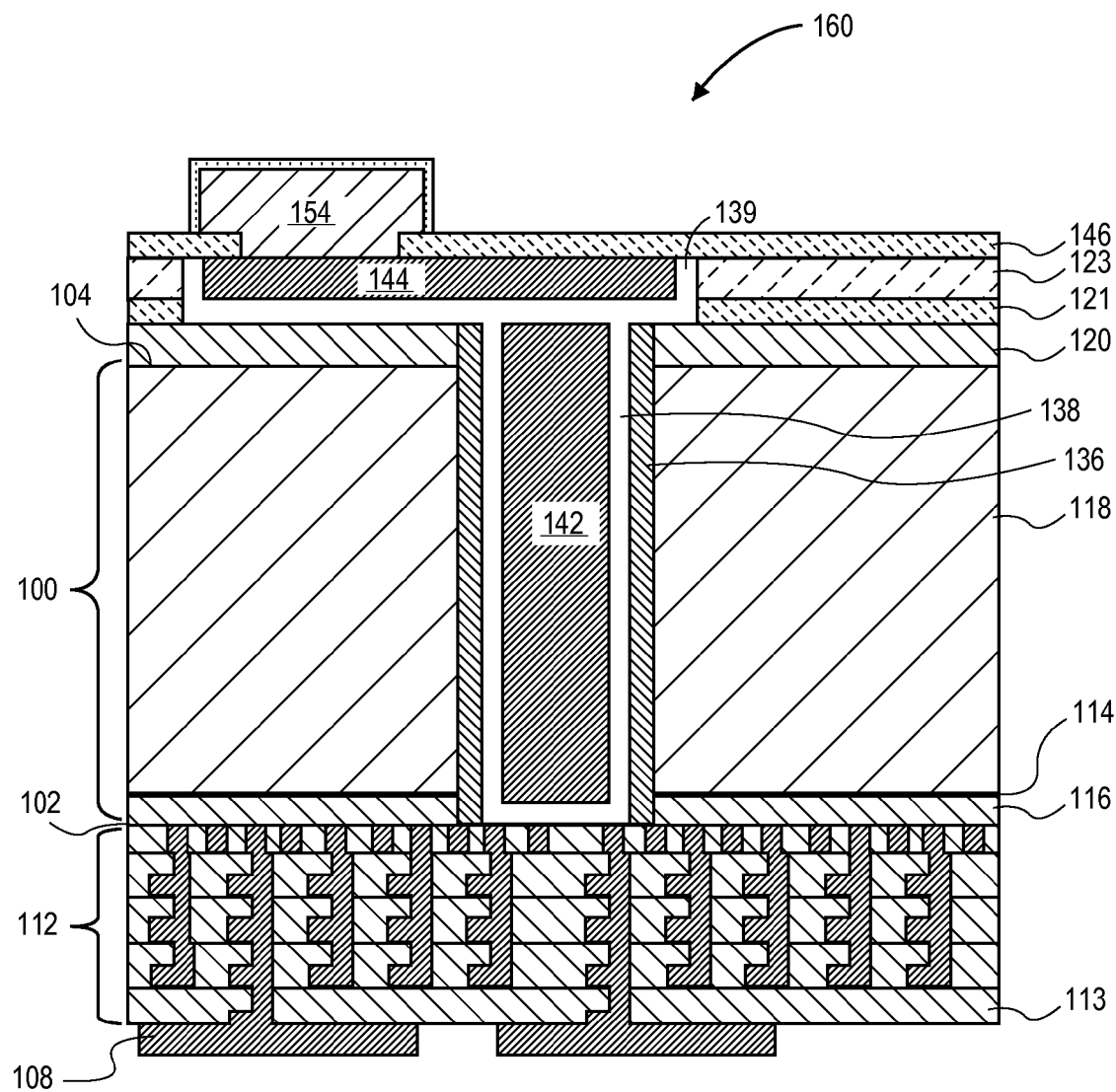

Referring to FIG. 25, in an embodiment a 3D interconnect structure 160 includes a semiconductor substrate 100 having a front surface 102 and a back surface 104, a via (e.g. TSV) 142 extending through the semiconductor substrate 100 between the front 102 and back 104 surfaces, and a single damascene redistribution layer (RDL) 144 formed over the back surface 104. A passivation layer 120 may be disposed between the back surface 104 and the RDL 144 to prevent moisture and trace metal contaminants from entering the semiconductor substrate 100. Suitable passivation layer materials may be silicon carbide and silicon nitride. In some embodiments, the semiconductor substrate 100 may be a TSV processed device wafer including a plurality of the described 3D interconnect structures. Alternatively, the TSV processed device wafer is singulated to form a plurality of the semiconductor substrates which may or may not be further processed to form a plurality of chips, which may then be integrated into 3D packaging structures. Thus, in an embodiment the 3D interconnect structure 160 is a chip.

Figure 26:
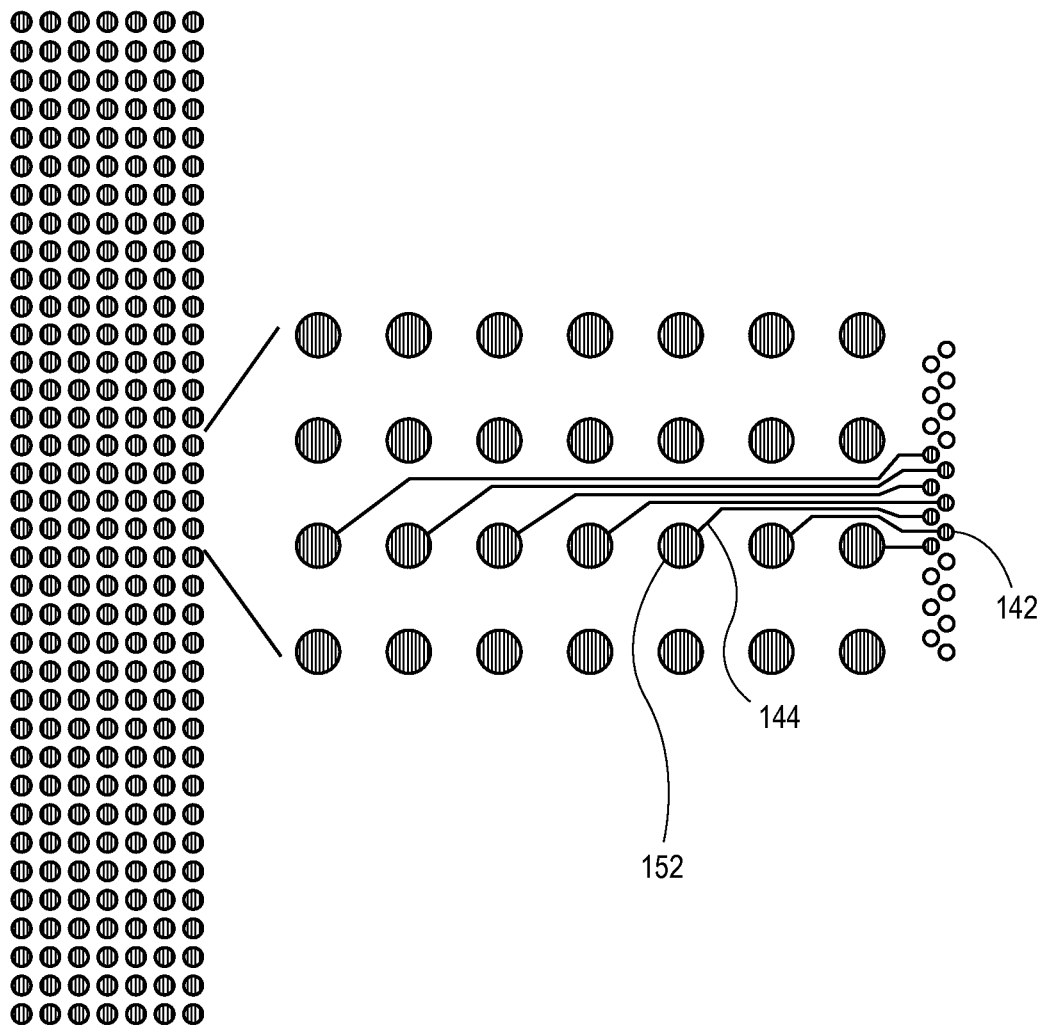
FIG. 26 is a schematic top view illustration of a 3D interconnect structure in accordance with embodiments of the invention.

Referring to FIG. 26, in an embodiment the 3D interconnect structure 160 includes an array of landing pads 152 arranged over the back surface 104 in a series of rows and columns. For example, the rows and columns in the array may have a pitch of 10 µm to 500 µm. An array of TSVs 142 may be arranged under the back surface 104 such that the array of TSVs 142 is not arranged in a pattern identical to the array of landing pads 152. In an embodiment, the array of TSVs 142 is not directly underneath the array of landing pads 152. In such an embodiment, a plurality of RDLs 144 may run between two of the rows of the landing pads 152 connecting one of the two rows to a corresponding number of TSVs 142 in the array of TSVs. For example, the two rows of the landing pads may be separated by a pitch of 10 µm to 500 µm. In this manner, RDLs 144 allow for flexibility in the physical locations of the TSVs 142 and circuit layout.

Figure 27:
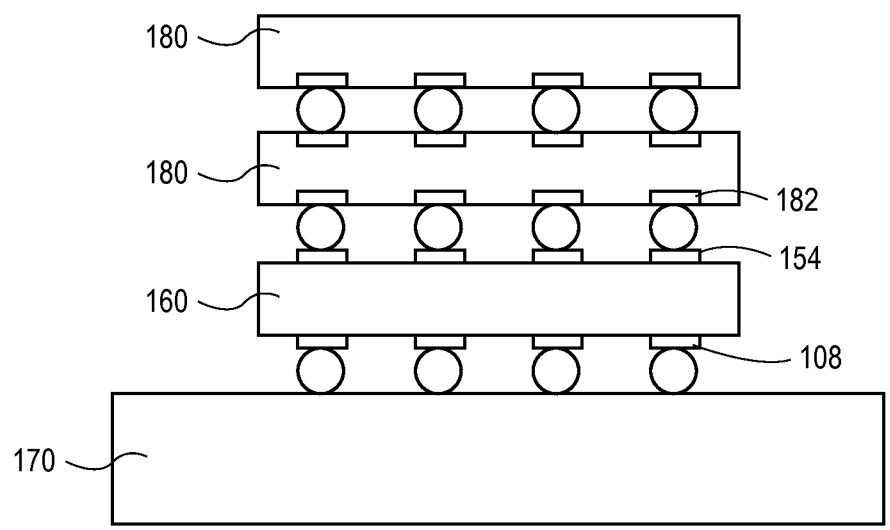
FIG. 27 is a side view illustration of a 3D package implementing TSVs in accordance with embodiments of the invention.

Referring to FIG. 27, in an embodiment a 3D package includes a base substrate 170 such as a printed circuit board or laminated substrate. A chip stack is formed over the base substrate in which the chip stack includes a chip 160 formed with the 3D interconnect structure. In an embodiment, the chip 160 is a logic chip, and one or more memory chips 180 are stacked onto the logic chip 160 with the array of landing pads of the logic chip (underneath an array of conductive bumps 154) coupled with a corresponding array of landing pads 182 of the memory chip 180, though embodiments are not limited to such and may include a variety of chip-to-chip configurations.

In an embodiment, a method of forming a 3D interconnect structure including a via (e.g. TSV) and single damascene RDL is described. An etch stop layer may be formed over a back surface of a device wafer having a via (e.g. TSV) extending from the back surface to a front surface of the device wafer, and a dielectric layer is formed over the etch stop layer. A trench opening is then formed in the dielectric layer and etch stop layer to expose the via, and a bulk volume of the trench opening is filled with a conductive metal to form a RDL including a landing pad. In an embodiment, forming the trench opening may be performed with plasma etching the dielectric layer using a patterned photoresist layer as a mask, and stopping the plasma etching on the etch stop layer. The etch stop layer may then be etched using an etching chemistry which does not substantially etch the dielectric layer, or an insulating liner layer of the underlying via. Subsequently, a conductive bump is formed over the landing pad, where the filled via is not directly beneath the landing pad.

In an embodiment, the via is formed in a via last processing sequence. In such an embodiment, prior to forming the via, a silicon carbide or silicon nitride containing passivation layer may be formed over the back surface of the device wafer. A via opening is then formed in the device wafer between the back surface and the front surface of the device wafer. An insulating liner layer is formed on the sidewalls of the via opening. A barrier layer is formed within the via opening and over the passivation layer, and then a bulk volume of the via may then be filled with a conductive metal such as copper by electroplating, for example. The conductive metal overburden and the barrier layer between via openings is then removed from over the passivation layer by chemical mechanical polishing, for example. In this manner, the passivation layer not only can function to prevent moisture and trace metal contaminants from entering the device wafer, but also function as a polish stop layer allowing for a large amount of overpolish to be incorporated into the TSV barrier layer CMP step without causing a significant amount of the passivation layer to also be removed.

Referring now to FIGS. 1-25 a method of manufacturing a 3D interconnect structure is described with reference to the figures. An inverted device wafer 100 is illustrated in FIG. 1 which may include a front surface 102 and a back surface 104. The device wafer 100 may have a variety of formations. For example, the device wafer may be a bulk semiconductor, include an epitaxial layer overlying a bulk semiconductor, or include a semiconductor-on-insulator (SOI) structure, though other structures may be used. In the particular embodiment illustrated, the device wafer 100 includes a (SOI) structure including semiconductor layer 116 overlying insulator layer 114, and bulk substrate 118. The device wafer 100 may additionally include doped regions or other doped features to form various microelectronic devices such as metal-insulator-semiconductor field effect transistors (MOS-FETs), capacitors, inductors, resistors, diodes, micro-electro-mechanical systems (MEMS), other suitable active or passive devices, and combinations thereof.

A metallization structure 112 may be formed over the front surface 102 of the device wafer 100. As illustrated, metallization structure 112 includes multiple interconnect layers formed of conductive metals such as copper, aluminum, etc. and interlayer dielectric materials such as silicon oxide, carbon doped oxide, silicon nitride, etc. A passivation layer 113 may be formed over an upper portion of the metallization structure 112 to provide physical and chemical protection. One or more conductive pads 108 (e.g. copper, aluminum, etc.) may be provided over the openings in the passivation layer 113.

Figure 2:
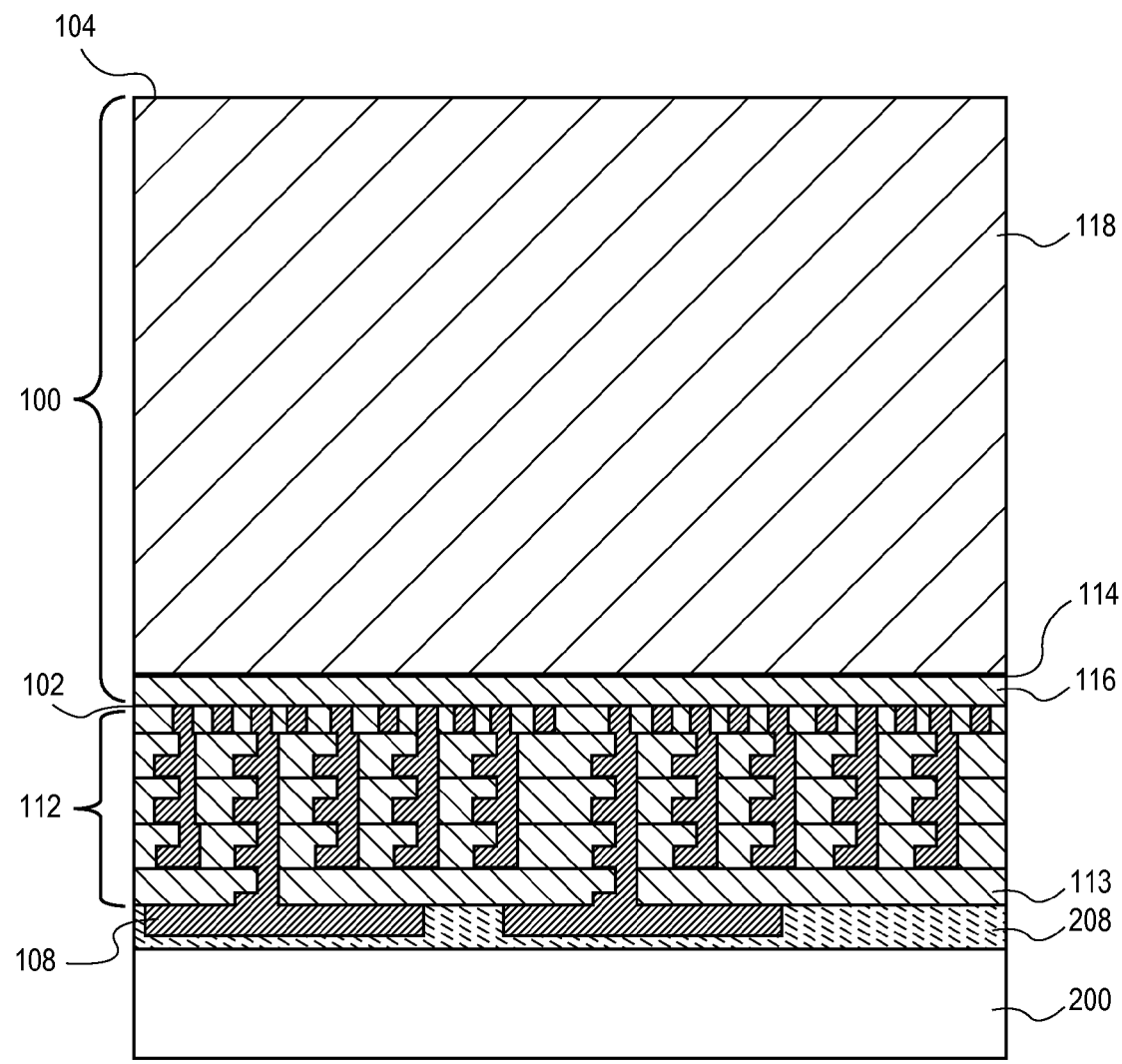
Figure 3:
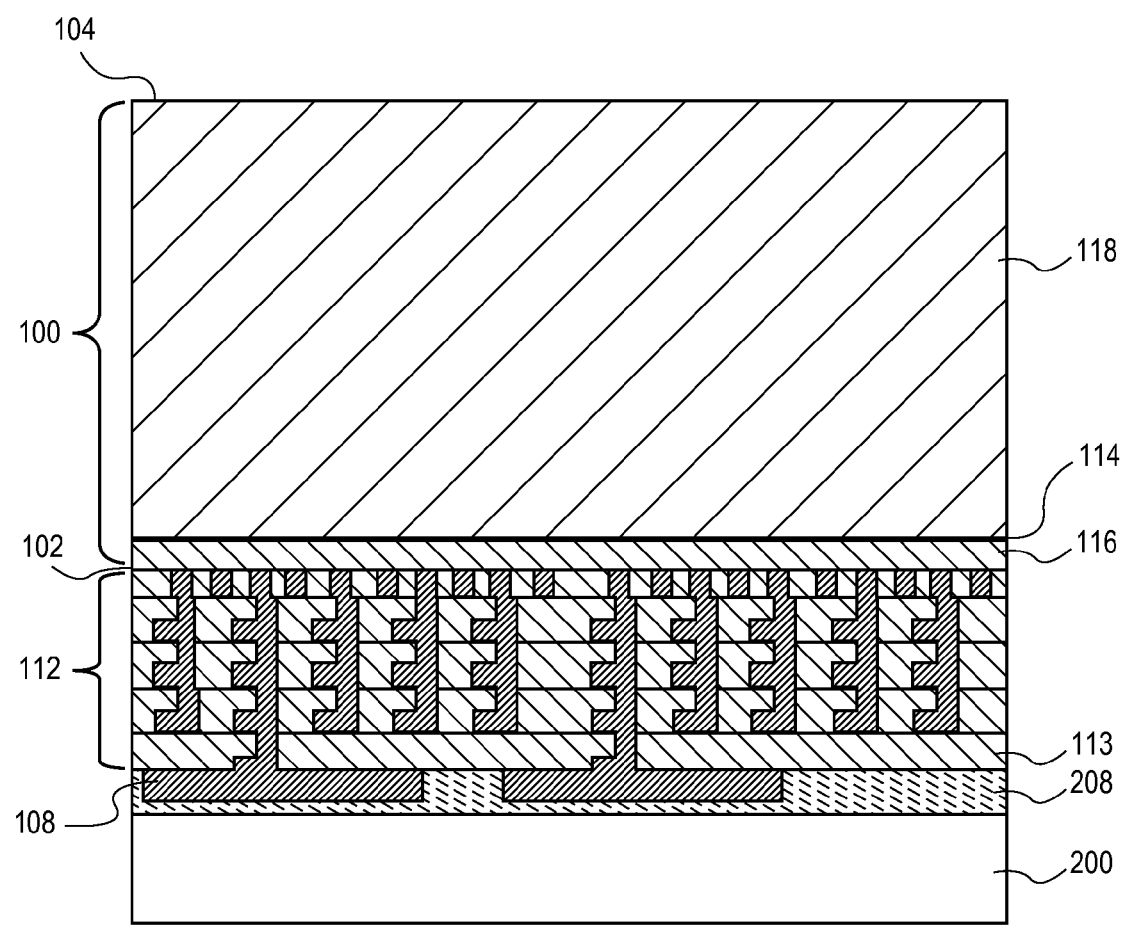

Referring now to FIGS. 2-3, the device wafer 100 is bonded to a temporary carrier wafer 200 using a commercially available temporary bonding adhesive 208 and equipment. The device wafer 100 may then be thinned back by grinding, chemical mechanical polishing (CMP), plasma etching and/or wet etching the back surface 104. For example, the device wafer 100 may be thinned back to approximately 50-100 µm in an embodiment.

Figure 4:
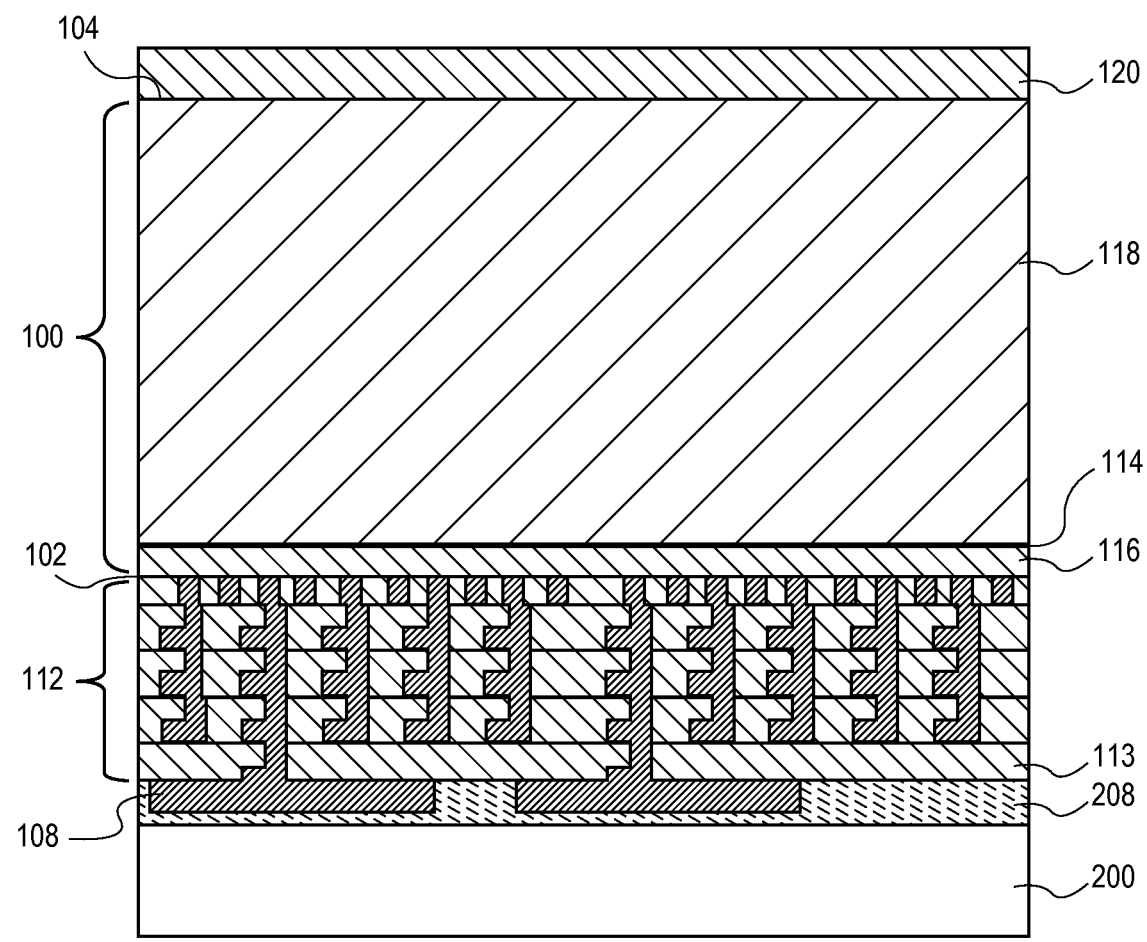

After thinning the device wafer 100 a passivation layer 120 may be formed over the back surface 104 to provide a hermetic barrier, as illustrated in FIG. 4. Suitable materials for the passivation layer 120 include silicon carbide and silicon nitride since these materials may provide a hermetic barrier that protects the back side 104 of the thinned device wafer 100 from trace metal and moisture contamination. Silicon carbide and silicon nitride may also possess significantly lower removal rates than subsequently deposited TSV barrier layer materials such as Ta or Ti during subsequent CMP removal of the barrier layer materials from over the passivation layer 120 between TSVs, as described with regard to FIG. 12. Passivation layer 120 may be deposited by suitable methods such as chemical vapor deposition (CVD). Passivation layer 120 may alternatively include multiple layers, such as a silicon nitride/silicon oxide stack or a silicon carbide/silicon oxide stack in which the silicon oxide is formed over the silicon nitride or silicon carbide and may be utilized as a hard-mask at the downstream via opening etch process.

Figure 5:
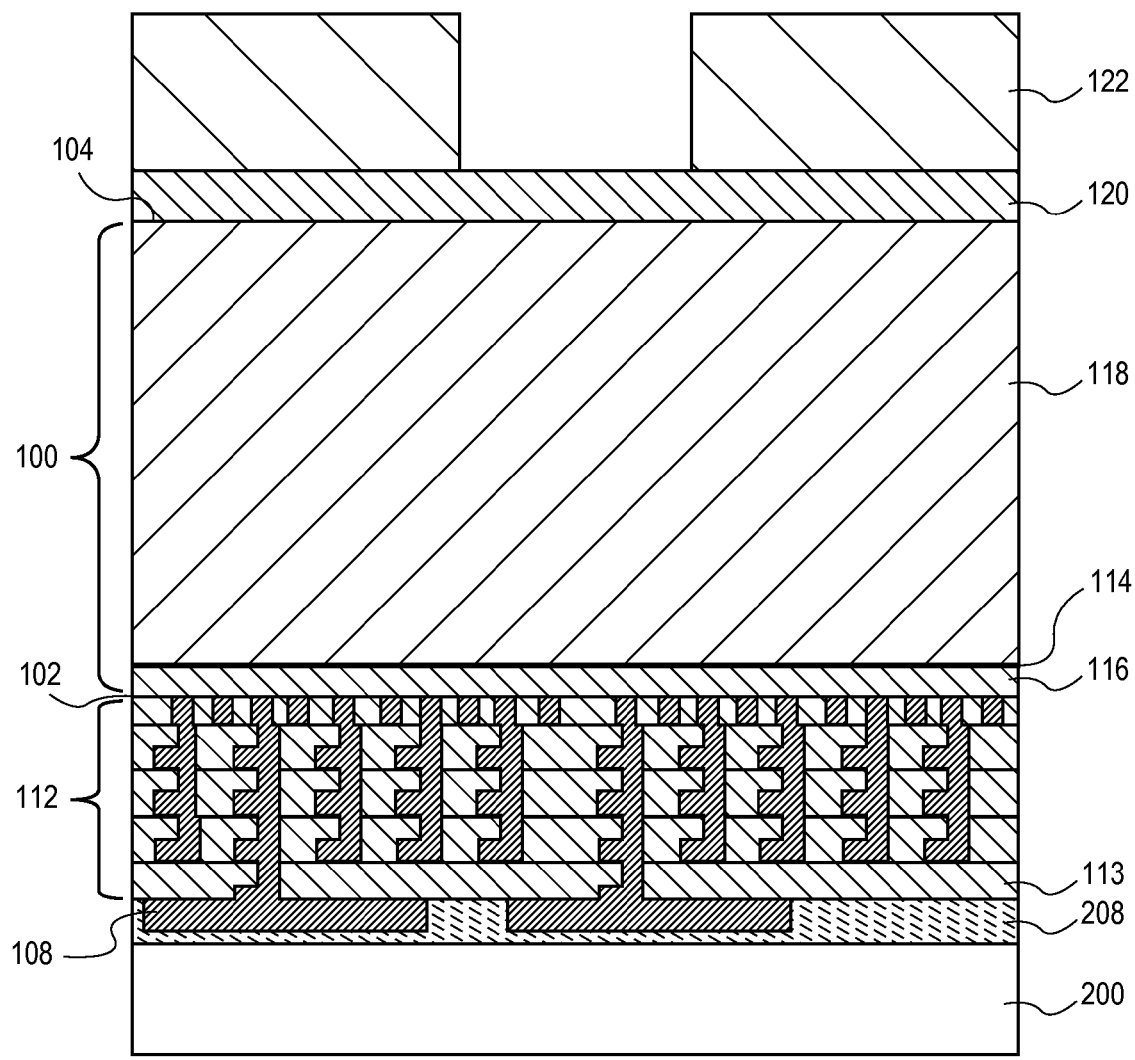
Figure 6:
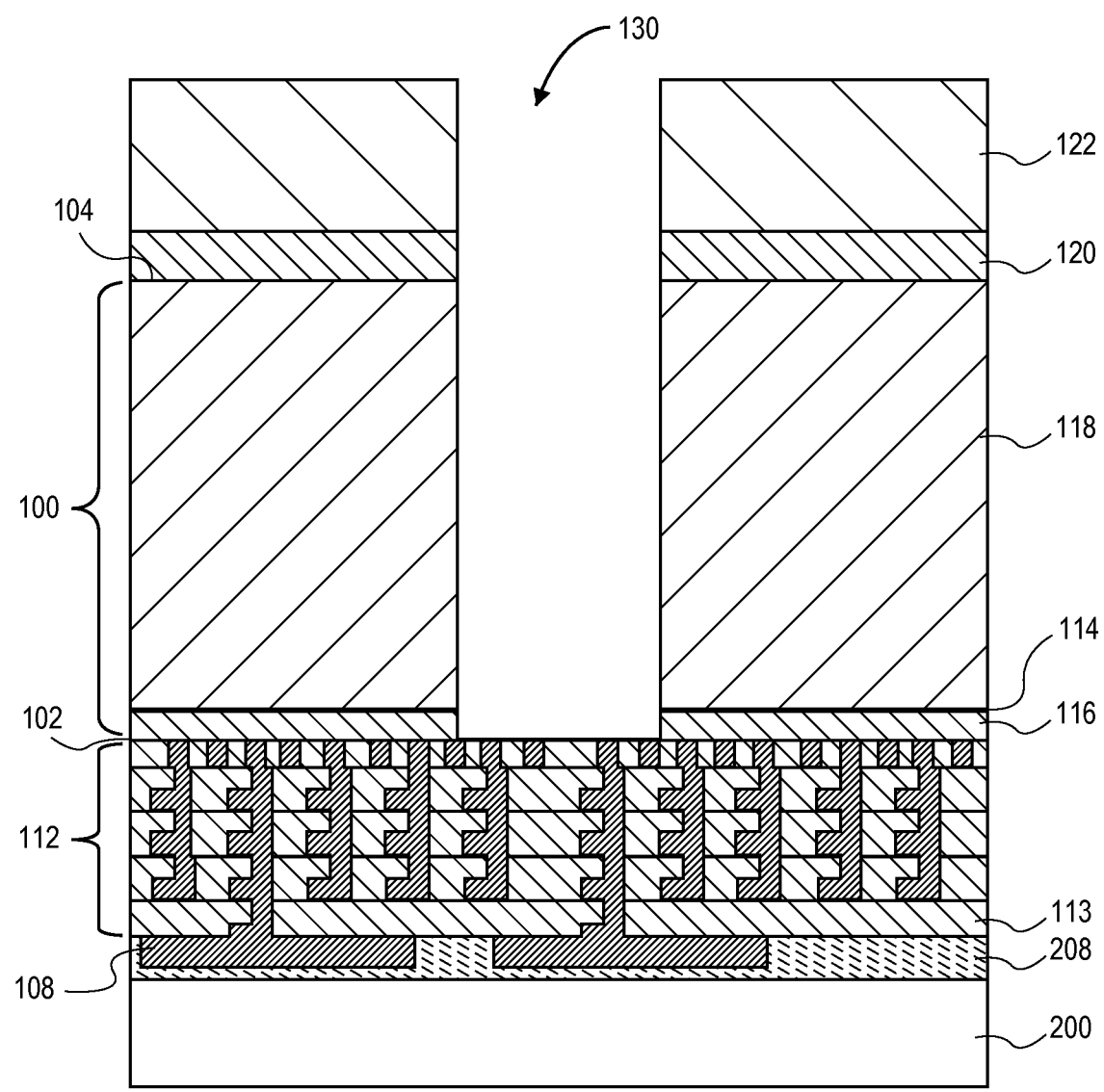
Figure 7:
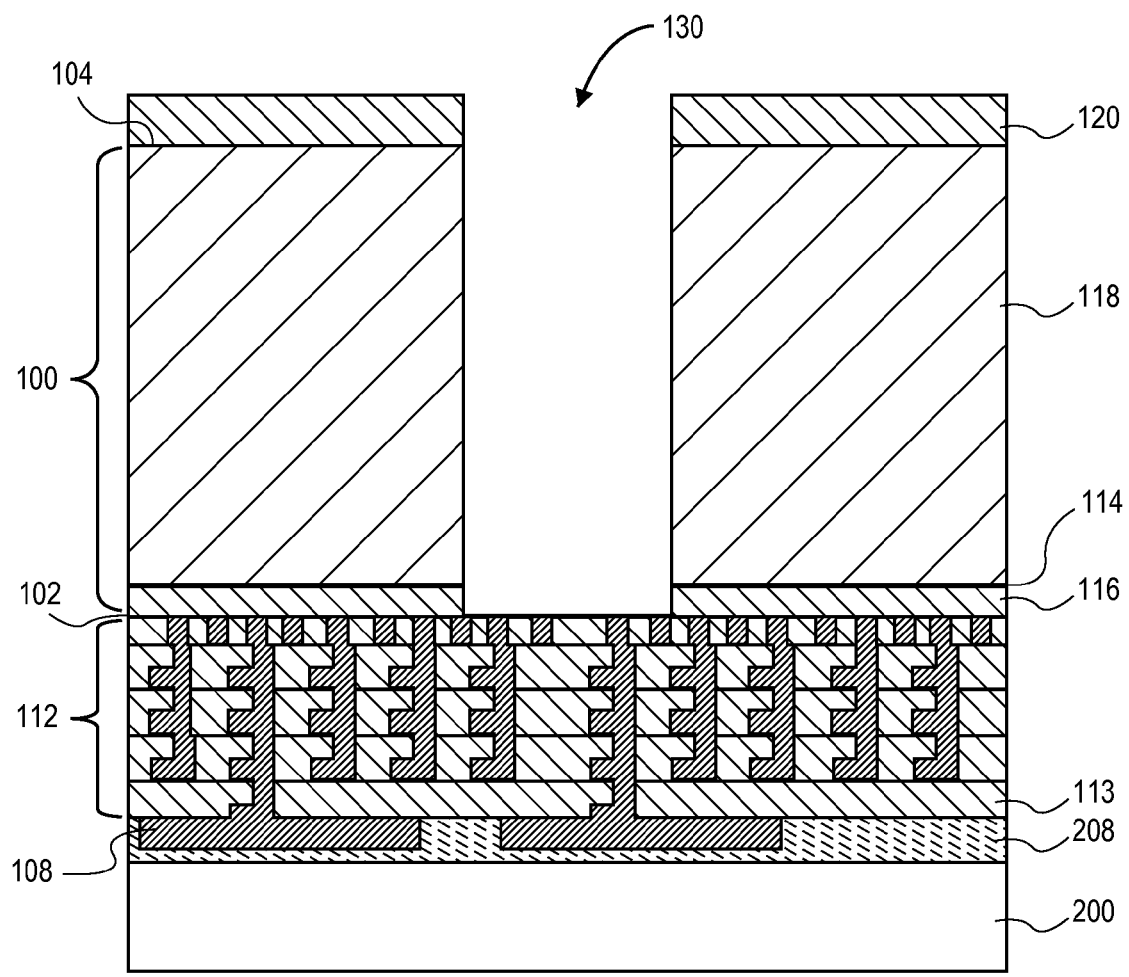

Referring now to FIGS. 5-7, a photoresist layer is coated onto the thinned device wafer, exposed and developed. After develop there are openings in the patterned photoresist layer 122 at those locations where vias (e.g. TSVs) are desired. Via openings 130 (e.g. TSV openings) are then etched using a suitable method such as plasma etching through the passivation layer 120, and through the device wafer 100 between the back surface 104 and front surface 102, stopping on copper landing pads within the metallization structure 112. The patterned photoresist layer 122 is then removed and any remaining etch polymers or residues may be cleaned off.

Figure 8:
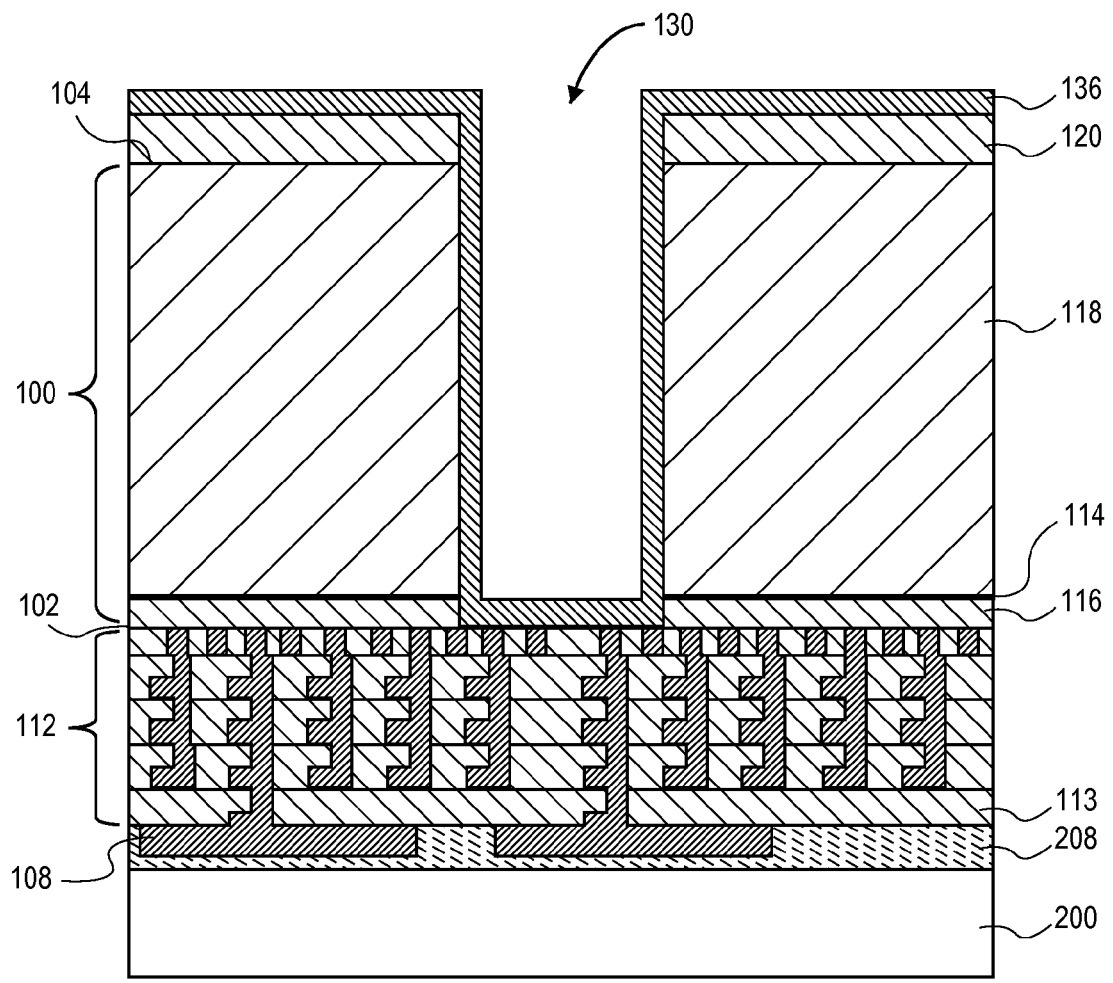
Figure 9:
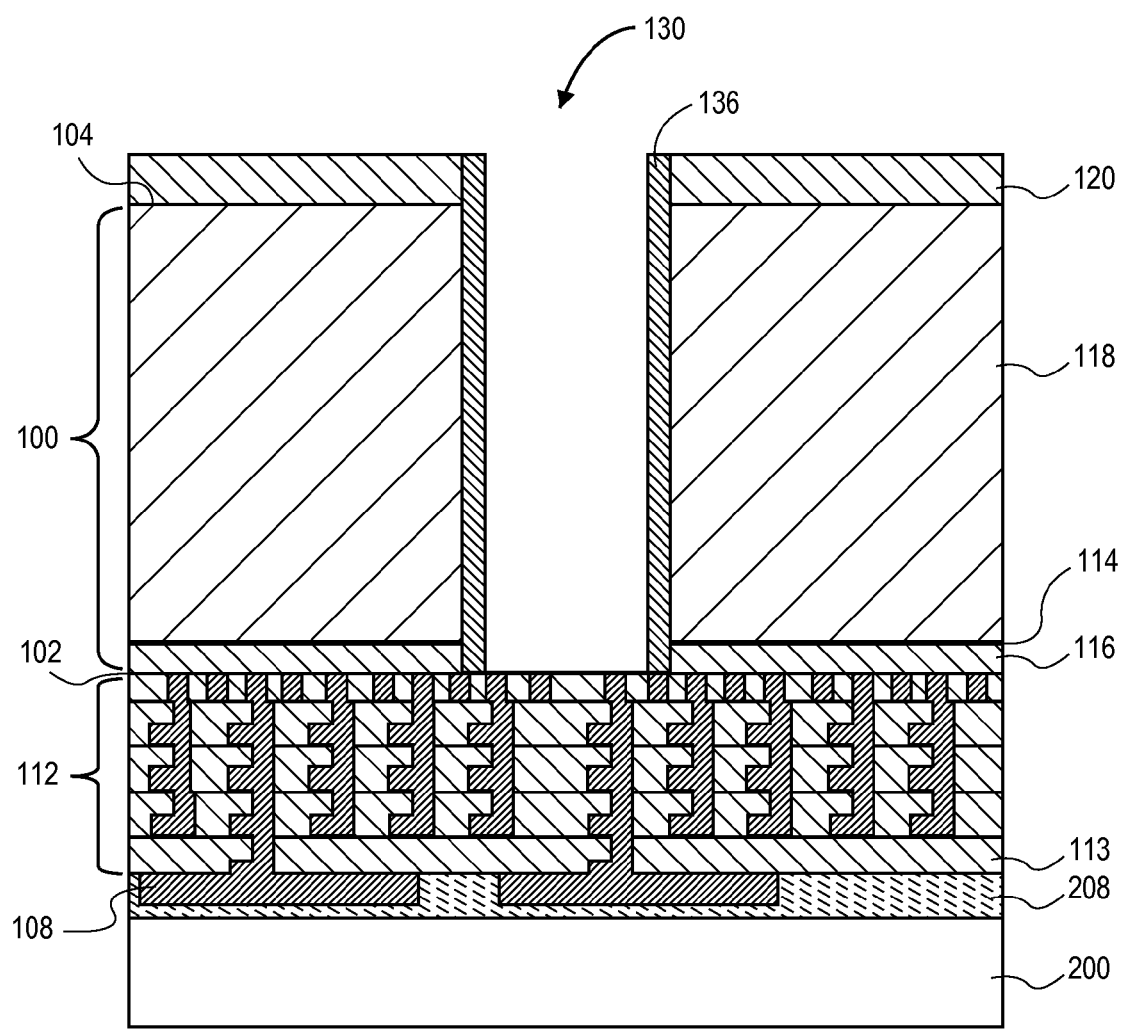

An insulating liner layer 136 is then deposited, lining the bottoms and sidewalls of the via openings 130, as well as the regions between via openings over passivation layer 120 as illustrated in FIG. 8. Suitable materials for insulating liner layer 136 include, but are not limited to, silicon dioxide, silicon nitride, silicon carbide, and various polymers. These materials may be deposited by CVD, atomic layer deposition (ALD), and spin coating methods, for example. As illustrated in FIG. 9, an anisotropic plasma etch process may then be used to remove the insulating liner layer 136 from the bottom surfaces of the via opening 130, as well as from the regions between via openings over passivation layer 120, while retaining a substantial thickness of the insulating liner layer 136 on the side surfaces of the via openings 130. In such an embodiment, the insulating liner layer 136 may be formed directly on the via opening 130 sidewalls defined by the bulk silicon substrate 118. Thus, the insulating liner layer 136 functions in the final 3D interconnect structure to insulate the TSV from the surrounding silicon substrate material.

Figure 10:
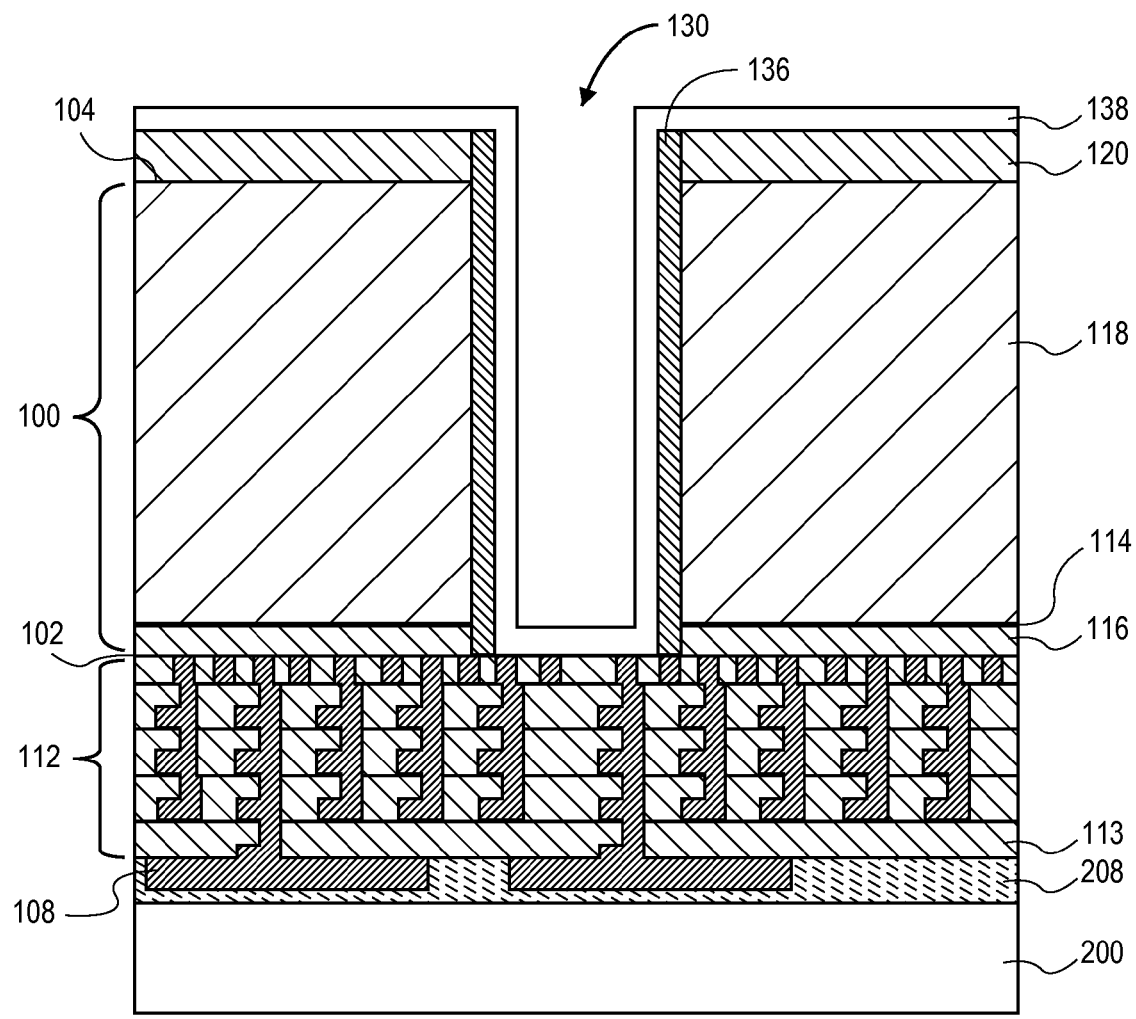
Figure 11:
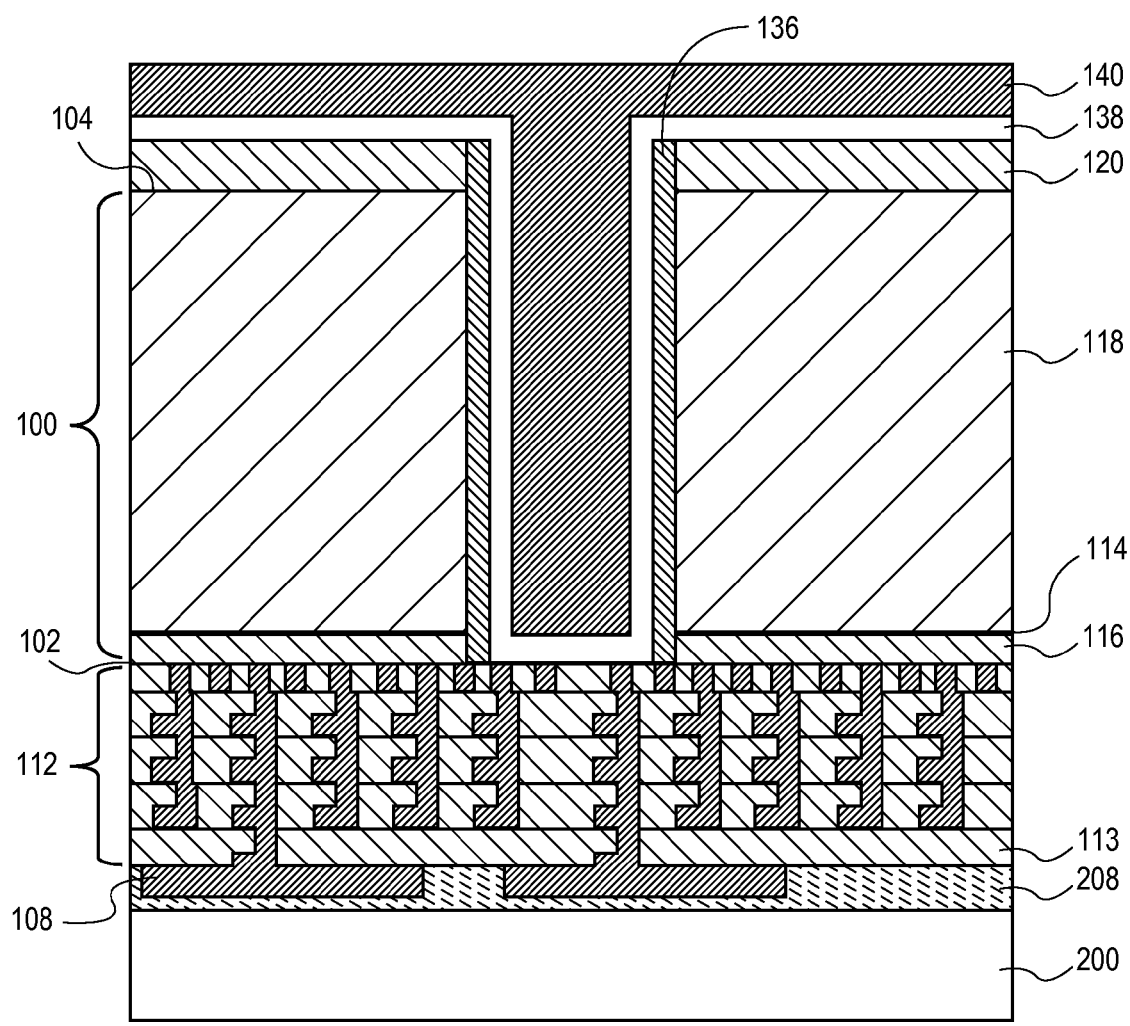
Figure 12:
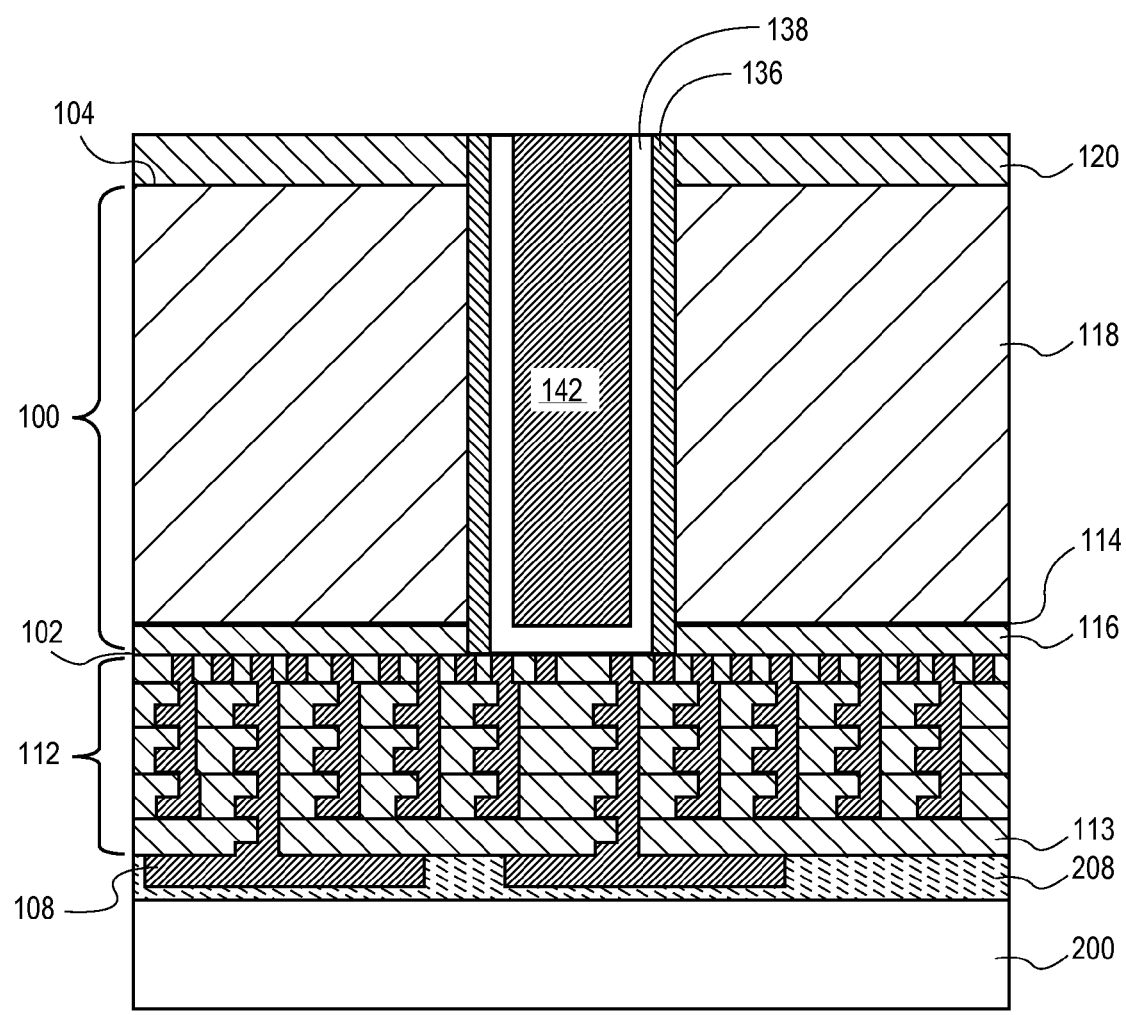
Figure 13:
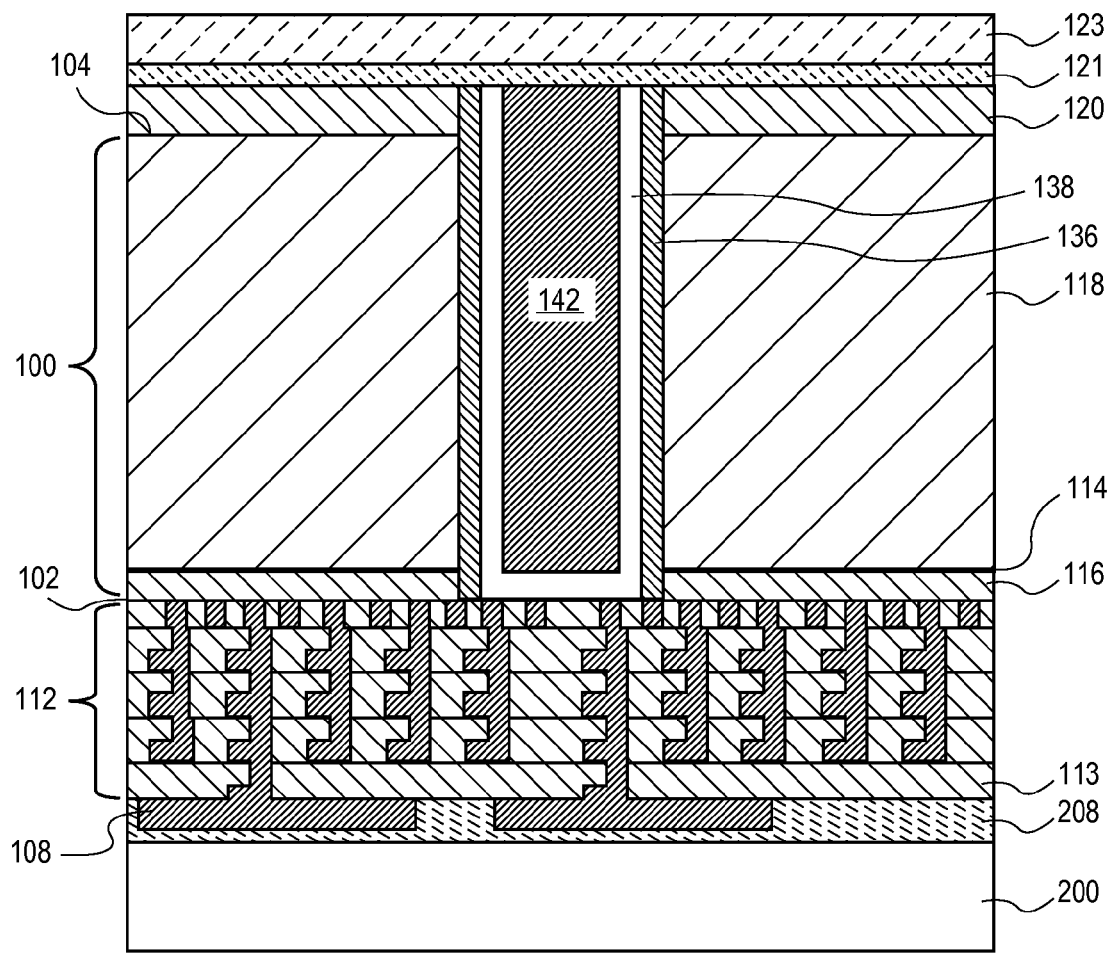
Figure 14:
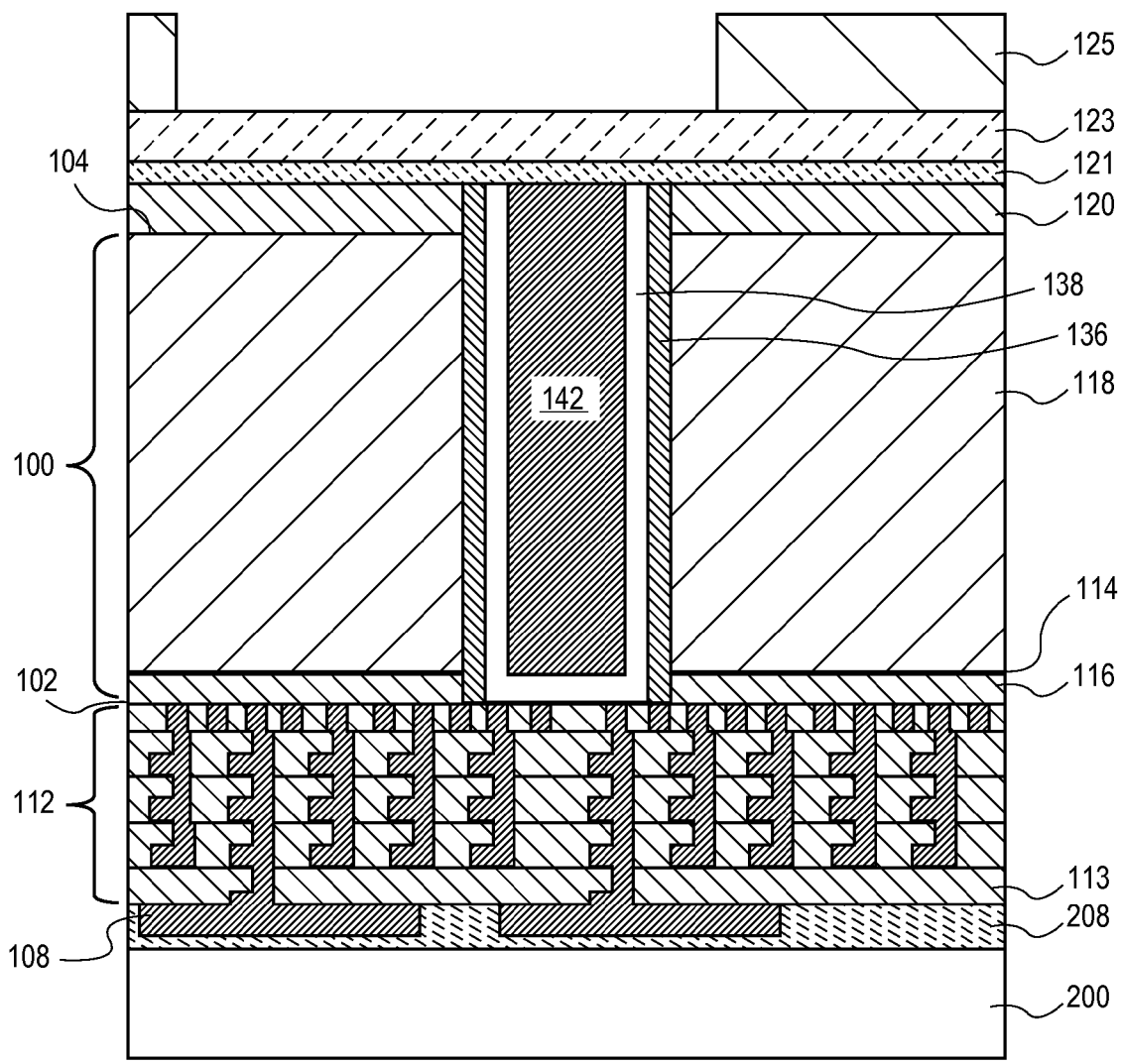
Figure 15:
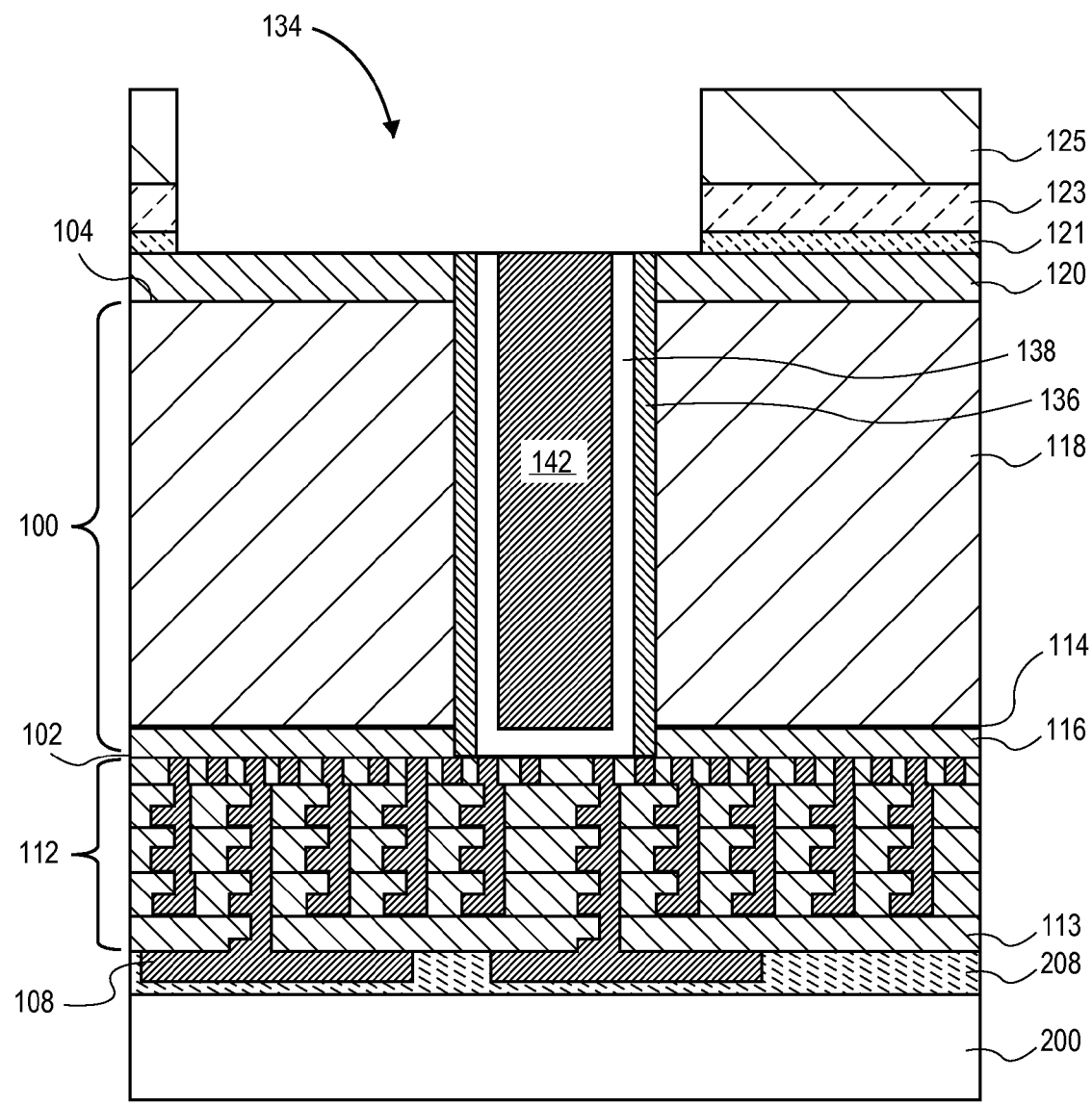
Figure 16:
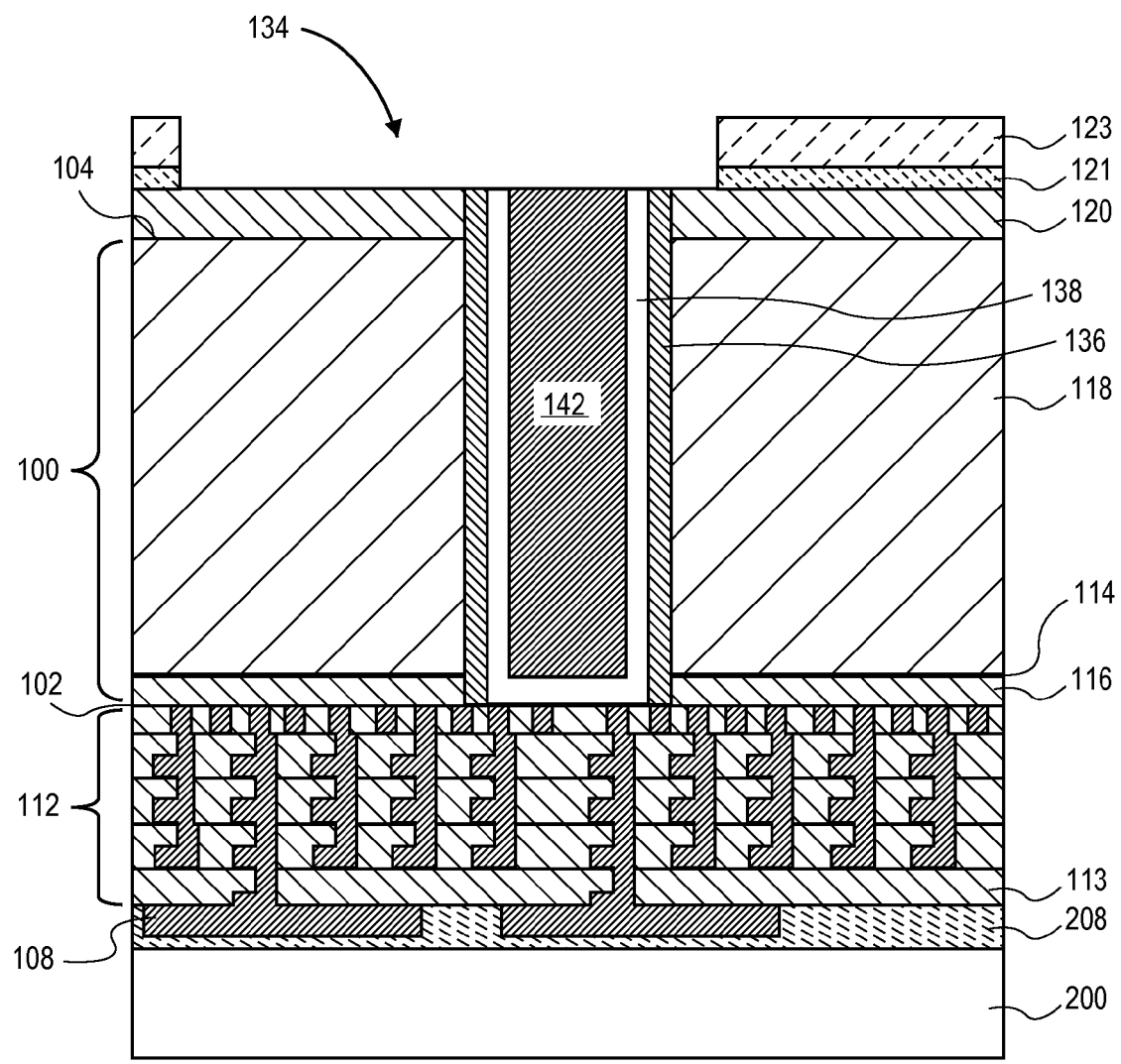

Referring to FIGS. 10-12, a barrier layer 138 and seed layer may then be deposited onto the device wafer surface. For example, the barrier layer 138 may include tantalum, titanium, or cobalt. The seed layer may be copper, for example. A blanket layer of copper 140 is then electroplated onto the device wafer surface, completely filling the TSV openings 130 with copper. The copper overburden and the barrier layer over passivation layer 120 are then removed by CMP, as illustrated in FIG. 12. The resultant structure includes TSVs 142 which extend through the device wafer 100 between the front 102 and back 104 surfaces. In such a configuration a single metal fill 140 occupies the bulk volume of the TSVs 142, which may be lined with barrier layer 138 and seed layer (e.g. for electroplating) and the insulating liner layer 136.

In an embodiment, the copper 140 overburden is removed in a first CMP operation with a first slurry, followed by removal of the barrier layer 138 from over the passivation layer 120 in a second CMP operation with a second slurry which is different from the first slurry. Commercially available CMP slurries for barrier layer 138 removal are engineered to etch barrier materials such as Ta, Ti, TaN and TiN, and are also typically engineered to etch oxide. In accordance with embodiments of the present invention, passivation layer 120 may function as a polish stop during removal of the barrier layer 138 which allows for the barrier layer 138 CMP operation to incorporate a large amount of overpolish without causing a significant amount of the passivation layer 120 to be removed.

Referring now to FIGS. 13-16 an etch stop layer 121 is formed over the passivation layer 120 and via 142. Suitable materials for etch stop layer 121 include silicon nitride or silicon carbide. A dielectric layer 123 is then formed over the etch stop layer 121. For example, dielectric layer 123 may include silicon dioxide. A photoresist layer is then coated over the dielectric layer 123, exposed and developed. After develop there are openings in the patterned photoresist layer 125 at those locations where fine pitch RDLs with landing pads are desired. Trench openings 134 are then etched through the entire depth of the dielectric layer 123 using the patterned photoresist layer 125 as a mask stopping on the etch stop layer 121 using a suitable technique such as plasma etching. In an embodiment, once the dielectric layer 123 is cleared down the etch stop layer 121 the plasma etch chemistry is changed to selectively etch the etch stop layer 121 while leaving the dielectric layer 123 sidewall of trench opening 134 and the underlying insulating liner layer 136 substantially unaffected. In accordance with embodiments of the invention, the etch stop layer 121 may protect the insulating liner layer 136 from being damaged during formation of the trench opening 134 to protect the integrity of the TSV structure. Following the etch process, the patterned photoresist layer 125 is removed and any remaining etch polymer or residues may be cleaned off.

Figure 17:
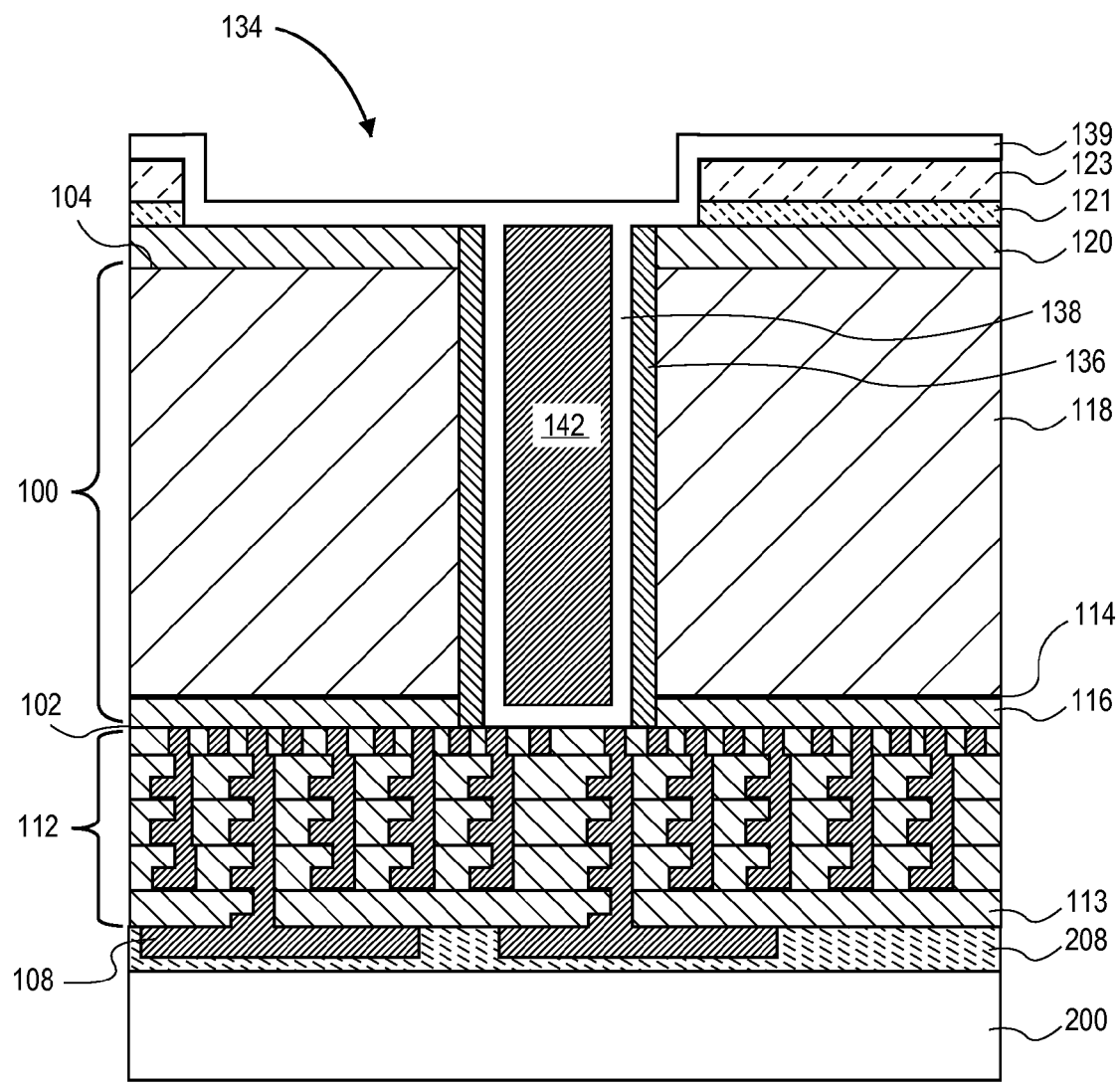
Figure 18:
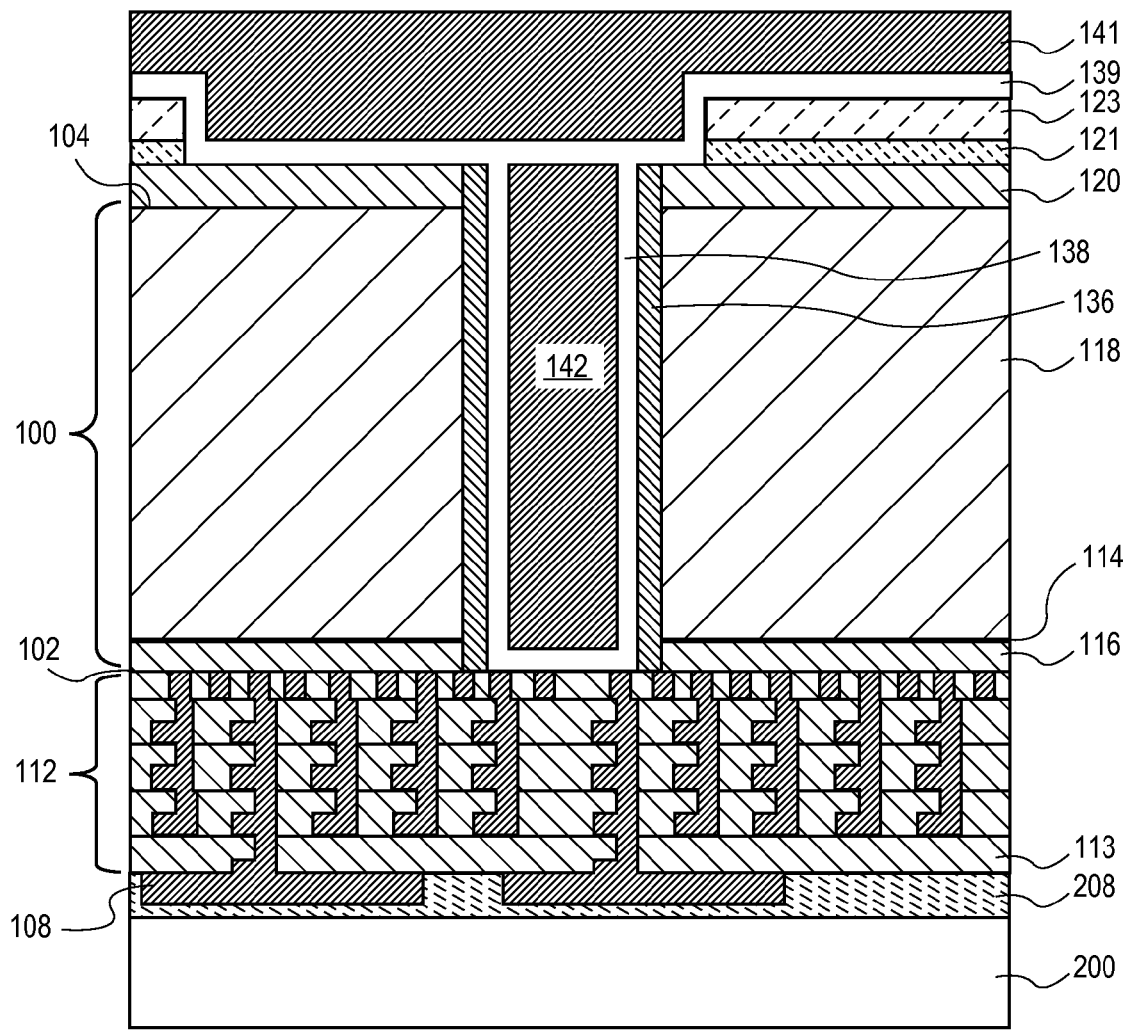
Figure 19:
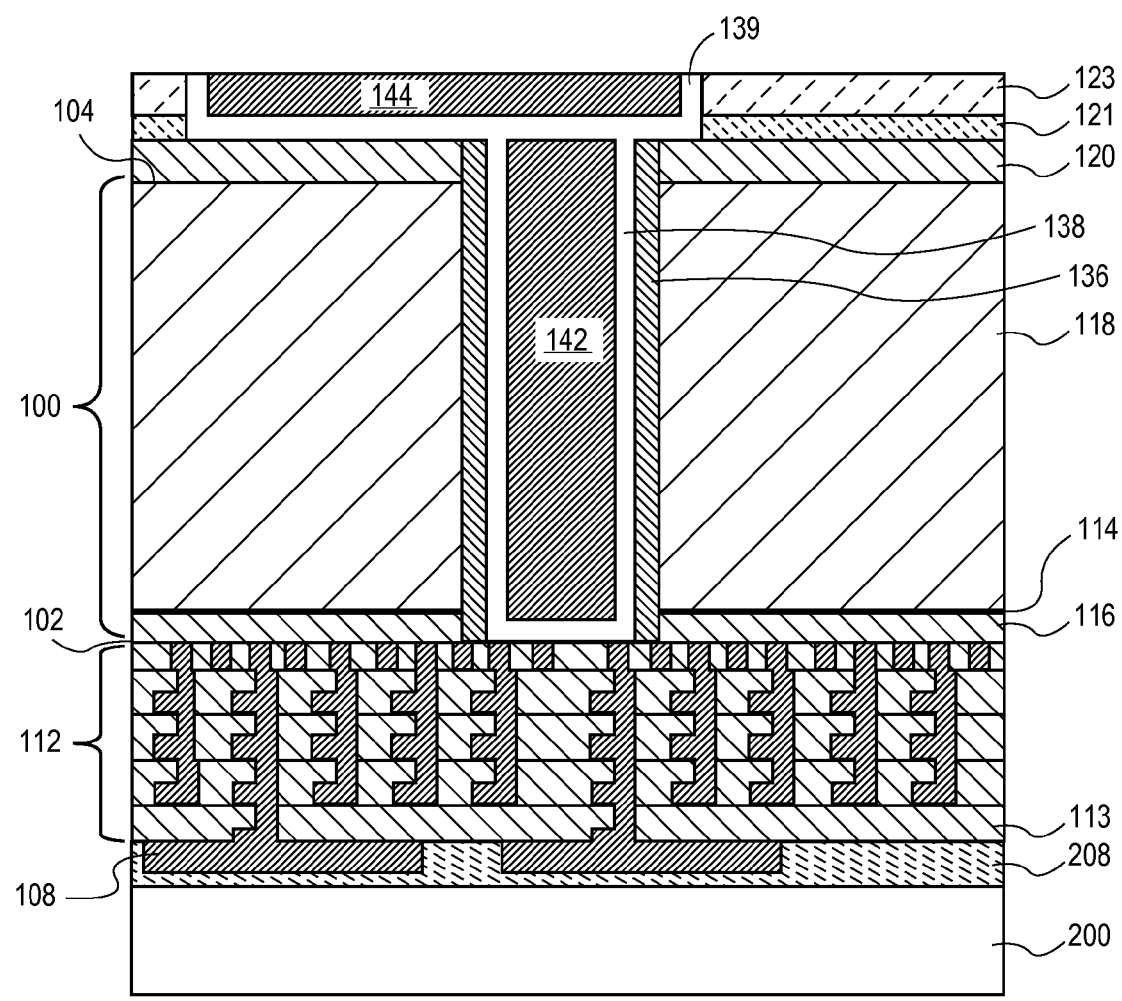
Figure 20:
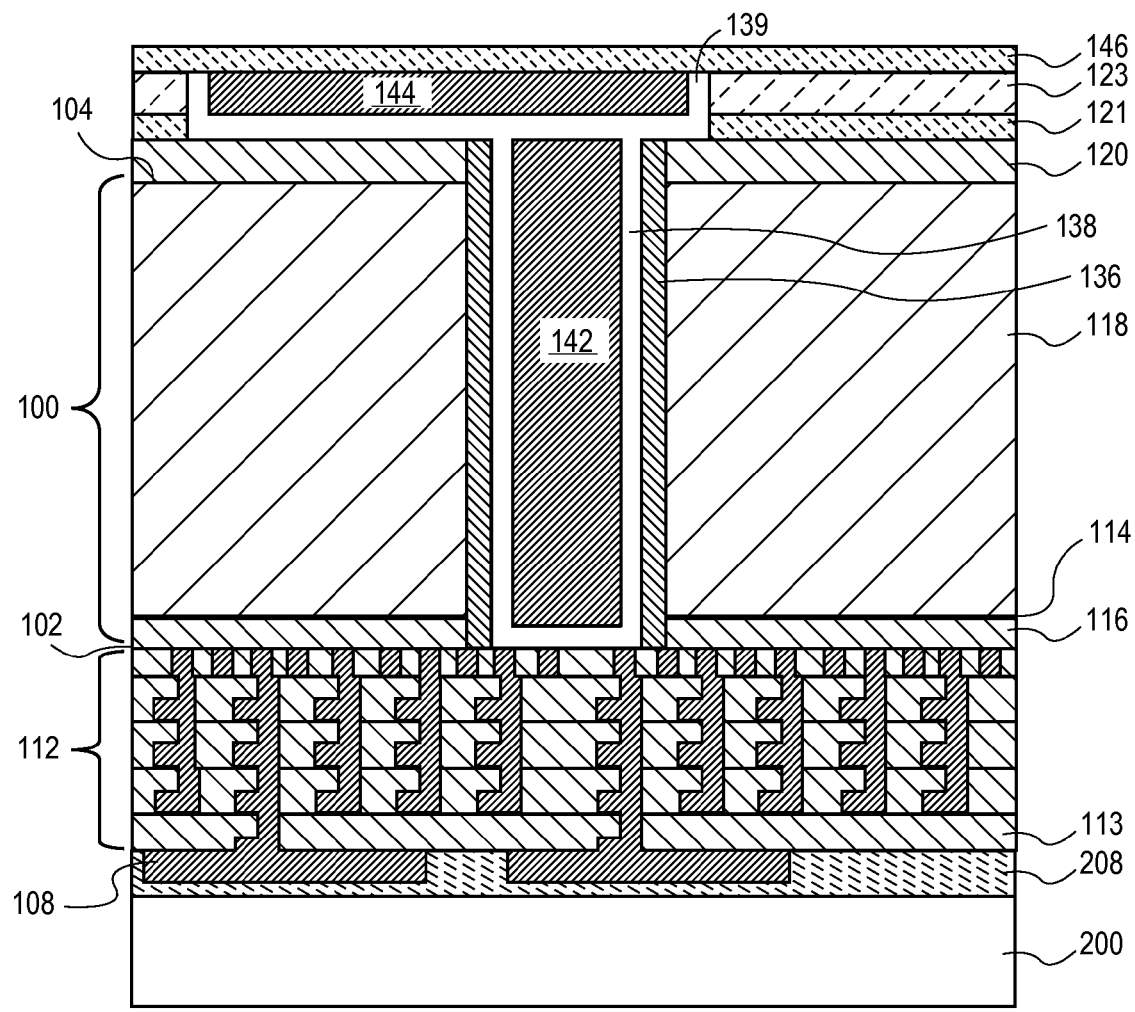
Figure 21:
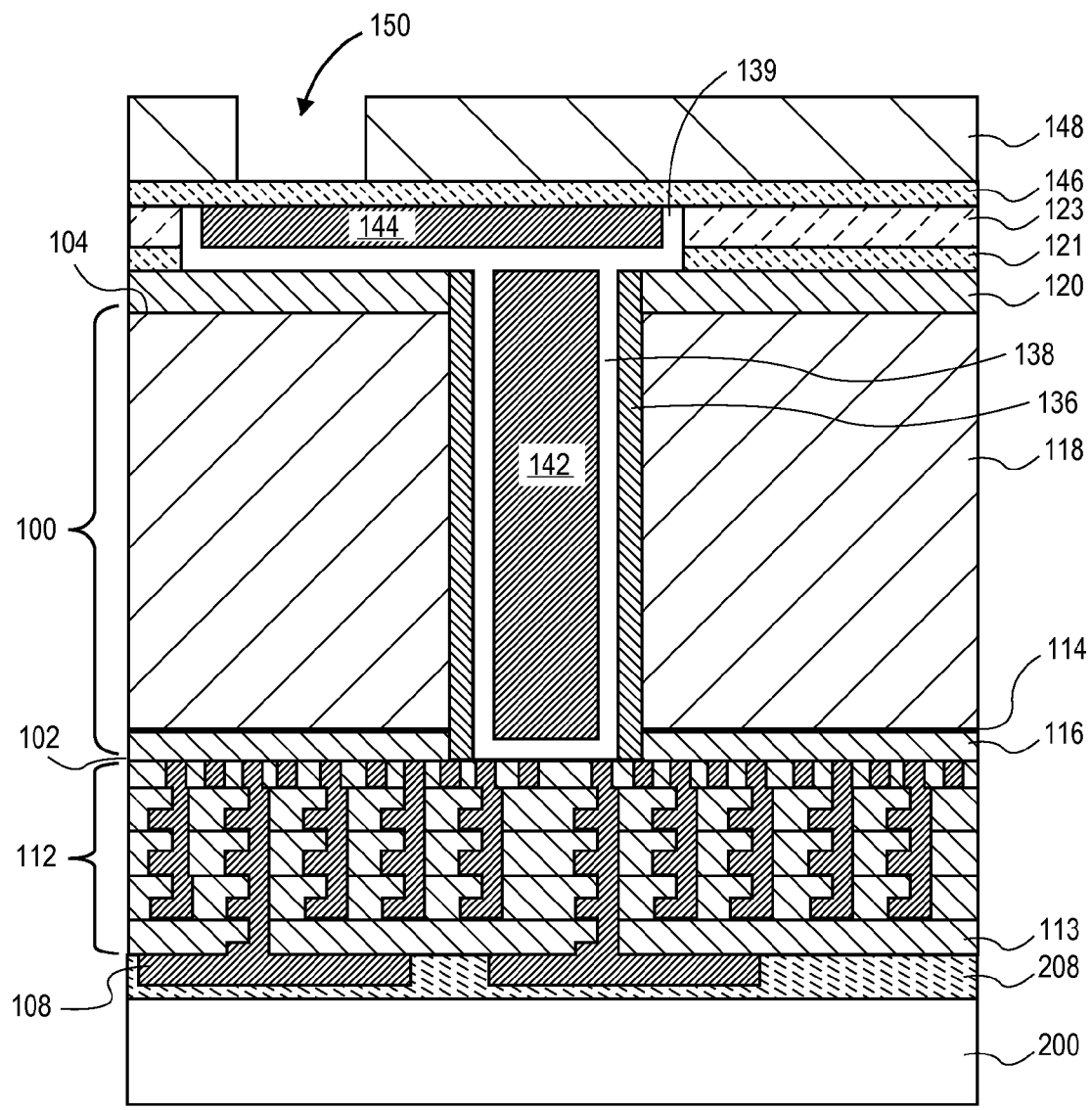
Figure 22:
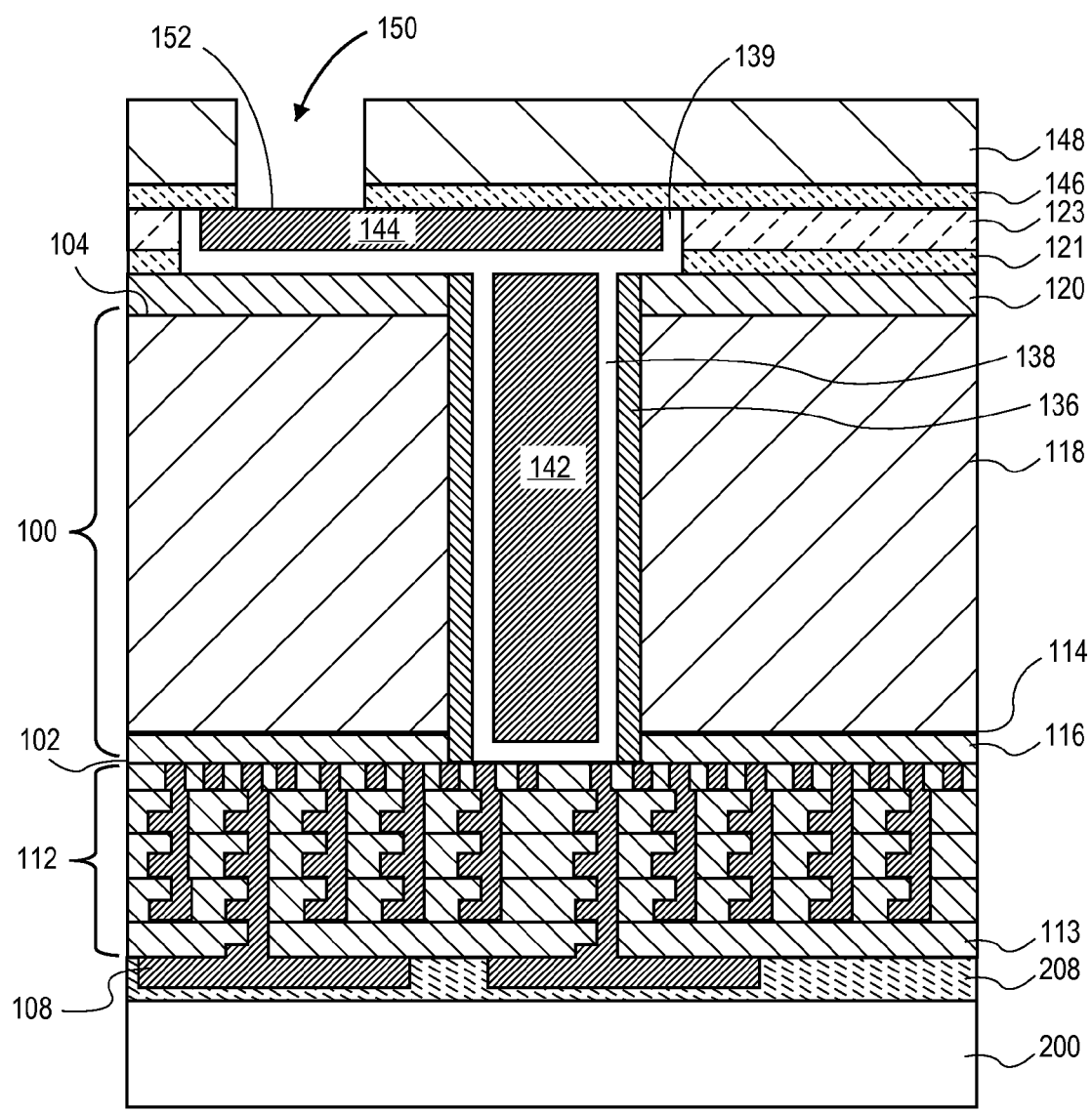
Figure 23:
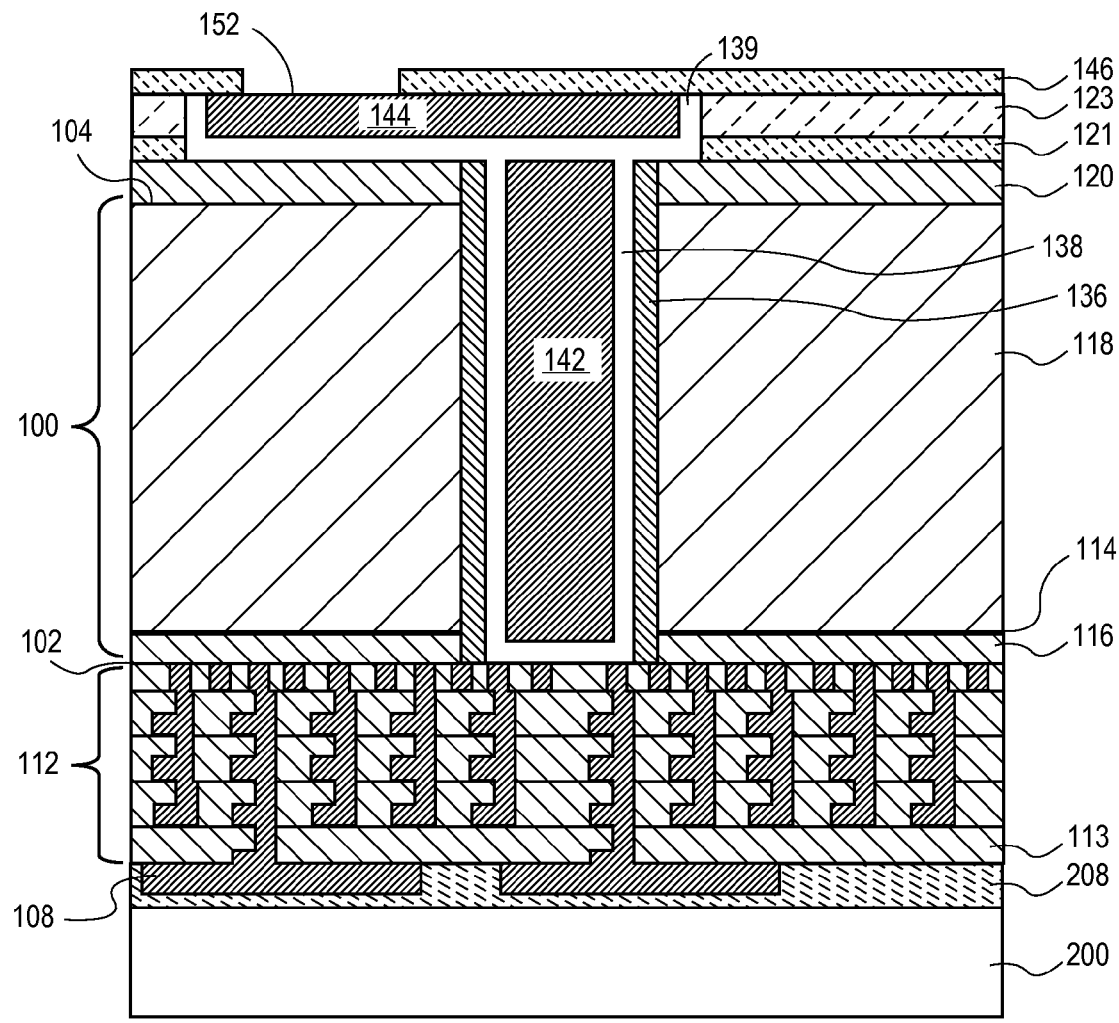

Referring now to FIGS. 17-19 a barrier layer 139 and seed layer may then be deposited onto the device wafer surface. For example, the barrier layer 139 may include, for example, Ta, Ti, TaN, TiN. The seed layer may be copper, for example. A blanket layer of copper 141 is then electroplated onto the device wafer surface, filling a bulk volume of the trench openings 134 with copper. The copper overburden and the barrier layer over dielectric layer 123 are then removed by CMP, as illustrated in FIG. 19. The resultant RDLs 144 may include a landing pad, where the via 142 is not directly underneath the landing pad, and may be lined with barrier layer 139 and seed layer (e.g. for electroplating). In an embodiment, the copper 141 overburden is removed in a first CMP operation with a first slurry, followed by removal of the barrier layer 139 over dielectric layer 123 in a second CMP operation with a second slurry which is different from the first slurry.

Referring now to FIGS. 20-23 landing pad openings are formed above the RDLs 144. A passivation layer 146 is deposited over of the planarized surface. Suitable materials include, but are not limited to, silicon nitride which may provide a hermetic barrier that protects against trace metal and moisture contamination, as well as protect the RDLs 144 from oxidation. A photoresist material is then coated over the passivation layer 146, exposed and developed to form a patterned photoresist layer 148. After develop there are openings 150 in the photoresist layer 148 at those locations where the RDLs 144 are to terminate at landing pads to which chip-to-chip connections are desired. Openings are then etched through the passivation layer 146 using a suitable technique such as plasma etching using the patterned photoresist layer 148 as a mask, stopping on the underlying RDL 144 landing pads 152. The photoresist layer 148 is then removed and any remaining etch polymer or residues may be cleaned off.

Figure 24:
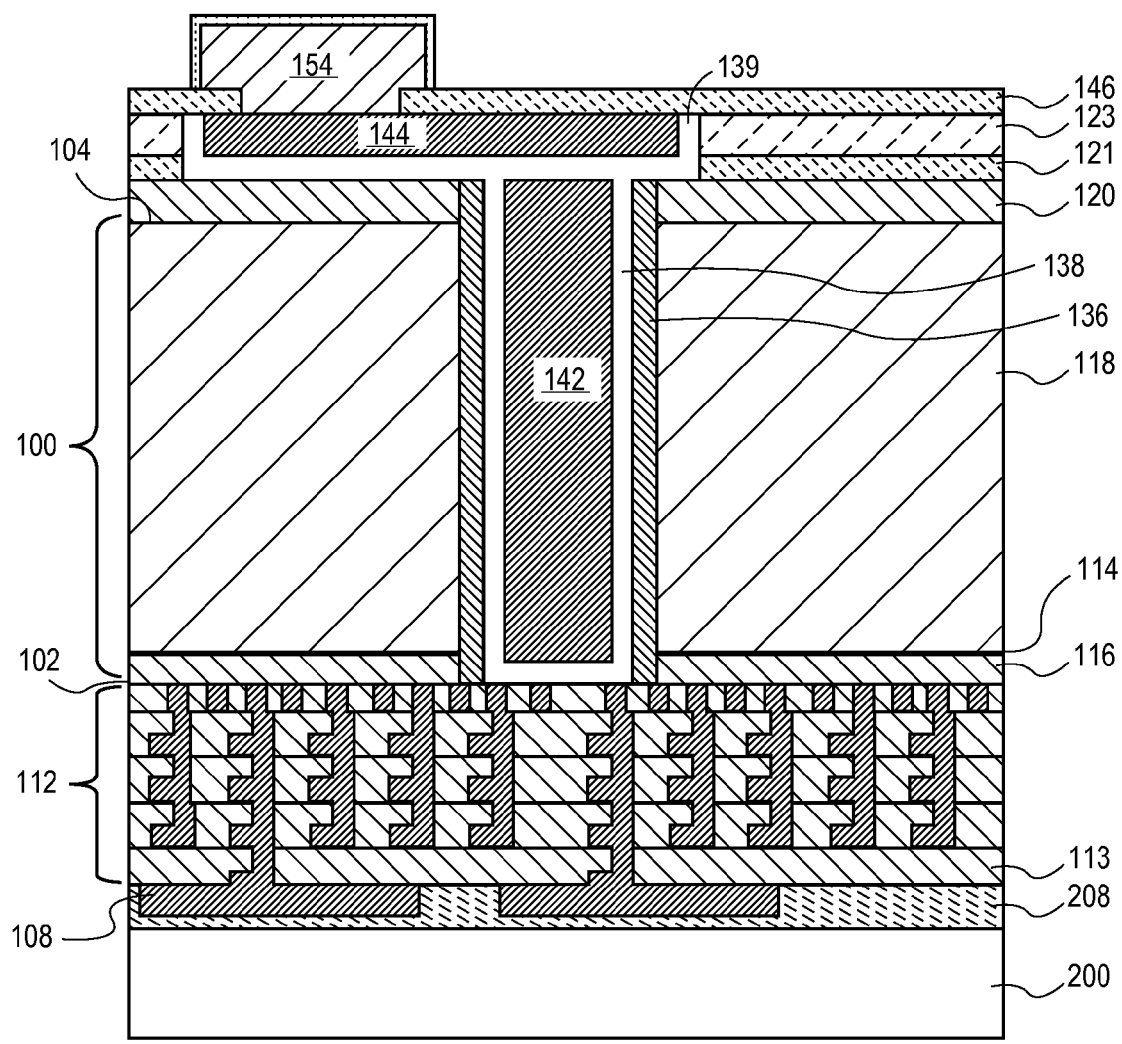

Referring now to FIG. 24 a conductive bump 154 is formed over each of the exposed RDL 144 landing pads 152. Any suitable technique may be implemented to form conductive bump 154 such as, but not limited to, solder bumping, electroplating using a patterning process, and electroless plating. In the particular embodiment illustrated in FIG. 24, the exposed RDL 144 landing pads 152 are coated with a solder-compatible surface finish. Exemplary surface finishes for conductive bumps 154 include electroless CoP/immersion Au, electroless CoWP/immersion Au, electroless NiP/immersion Au, electroless NiP/electroless Pd/immersion Au, electroless Sn, electroless NiP/electroless Sn, electroless CoP/electroless Sn, electroless CoWP/electroless Sn, electroless Cu/electroless CoP/immersion Au, electroless Cu/electroless CoWP/immersion Au, electroless Cu/electroless NiP/immersion Au, electroless Cu/electroless NiP/electroless Pd/immersion Au, electroless Cu/electroless Sn, electroless Cu/electroless NiP/electroless Sn, electroless Cu/electroless CoP/immersion Au, electroless Cu/electroless CoWP/electroless Sn. Other surface finishes may also be suitable depending upon the chip-to-chip solder material(s) and/or chip-to-chip attachment methods that are employed. In another embodiment, the conductive bump 154 may be a C4 or flip-chip bump formed of a material such as PbSn, Sn, SnAg, Cu, In, SnAgCu, SnCu, Au, etc.

The carrier wafer 200 and adhesive 208 may then removed from the device wafer 100 utilizing commercially available wafer de-bonding equipment and processing as illustrated in FIG. 25. Upon removal of the carrier wafer 200 and adhesive 208, the resulting plurality of 3D interconnect structures 160 illustrated in FIG. 25 may be singulated, and then may or may not be further processed to form chips, which may then be integrated into 3D packaging structures.

Referring to FIG. 26, an exemplary standardized chip-to-chip landing pad interface is illustrated for connecting a second chip to the 3D interconnect structure in accordance with embodiments of the present invention. As illustrated in more detail in the enlarged view, an array of landing pads 152 is arranged over the back surface 104 (see FIG. 25) in a series of rows and columns. An array of TSVs 142 is arranged under the back surface 104 such that the array of TSVs is not directly underneath the array of landing pads 152. A plurality of RDLs 144 runs between two of the rows of the landing pads 152 connects one of the two rows of landing pads 152 to a corresponding number of TSVs 142 in the array of TSVs. In this manner, TSVs connecting the backside landing pads 152 to frontside circuitry (metallization structure 112) can be located anywhere on the chip. While embodiments of the invention have been described in which the array of TSVs are not directly underneath the array of landing pads and/or conductive bumps, it is to be appreciated that some of the TSVs may be directly underneath the array of landing pads and/or conductive bumps. Embodiments of the present invention provide a flexibility for the location of the TSVs by the integration of single damascene processing. As a result, it is not required that the location of the array of TSVs be directly underneath the corresponding array of landing pads and/or conductive bumps to which the TSVs are connected.

In order to further illustrate the ability of embodiments of the present invention to allow for circuitry design flexibility, in one example, the array of landing pads 152 illustrated in FIG. 26 may have a vertical pitch of 50 µm and a horizontal pitch of 40 µm, and the landing pads 152 have a diameter of 20 µm. This leaves 30 µm to run the six RDLs 144 between two rows of landing pads 152 in the particular example. Assuming that the six RDL line widths and the seven spaces adjacent and between the RDLs 144 are the same, each RDL 144 may have a line width of 2.3 µm. Single damascene type processing in accordance with embodiments of the invention may be particularly suitable for accomplishing such exemplary fine pitch RDL architecture, though embodiments are not so limited and may also be used for any pitch of RDL architecture.

FIG. 27 is an illustrative example of a 3D package implementing certain aspects of a 3D interconnect structure in accordance with embodiments of the invention. As illustrated a plurality of chips are stacked over a substrate 170 such as a printed circuit board or laminated substrate. For example, chips 160 may include 3D interconnect structures as described herein. In one embodiment, chips 160 are logic chips including 3D interconnect structures as described herein and chips 180 are memory chips. For example, a 3D package may include one or more memory chips 180 stacked over a logic chip 160. A 3D package may alternatively include a logic chip 160 stacked over at least one memory chip 180. As illustrated, the array of conductive bumps 154, and consequently the landing pads 152 (not illustrated) underlying the conductive bumps 154 are aligned with the corresponding array of landing pads 182 of the memory chips 180, and conductive pads 108 are connected with the substrate 170. It is to be appreciated that while FIG. 27 is illustrative of exemplary stacking of logic chips 160 and memory chips 180, that embodiments of the invention are not limited to such and that the chips may be any suitable chip such as a memory (e.g. DRAM, eFLASH, eRAM, etc), interposer, RF, MEMS, etc.

Figure 28:
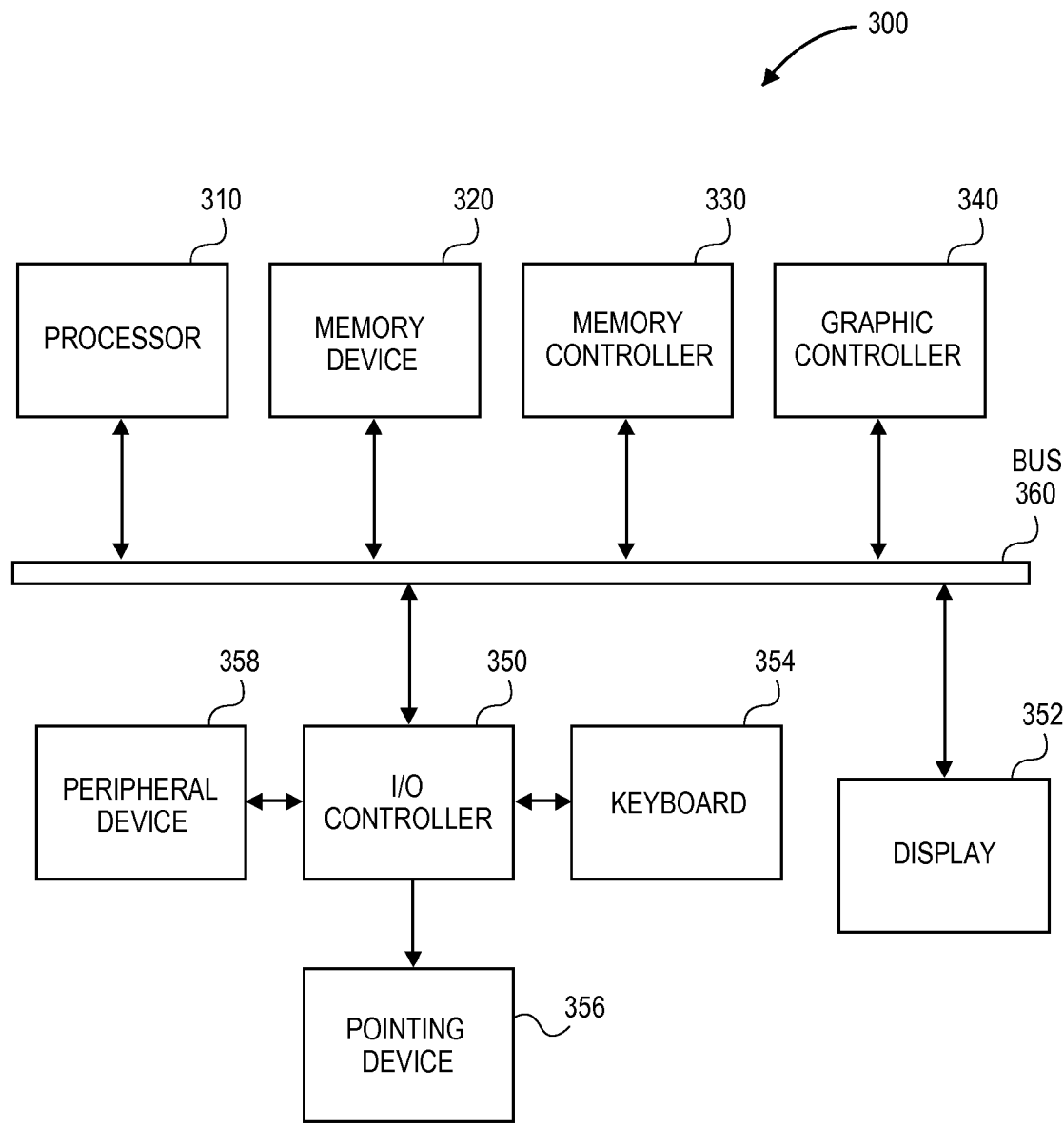
FIG. 28 represents a system in accordance with embodiments of the invention.

FIG. 28 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as a chip 160 or 3D package of FIG. 27 for example. For example, processor 310, or memory device 320, or at least a portion of I/O controller 350, or a combination of these components may be included in an integrated circuit package that includes at least one embodiment of a structure described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 29:
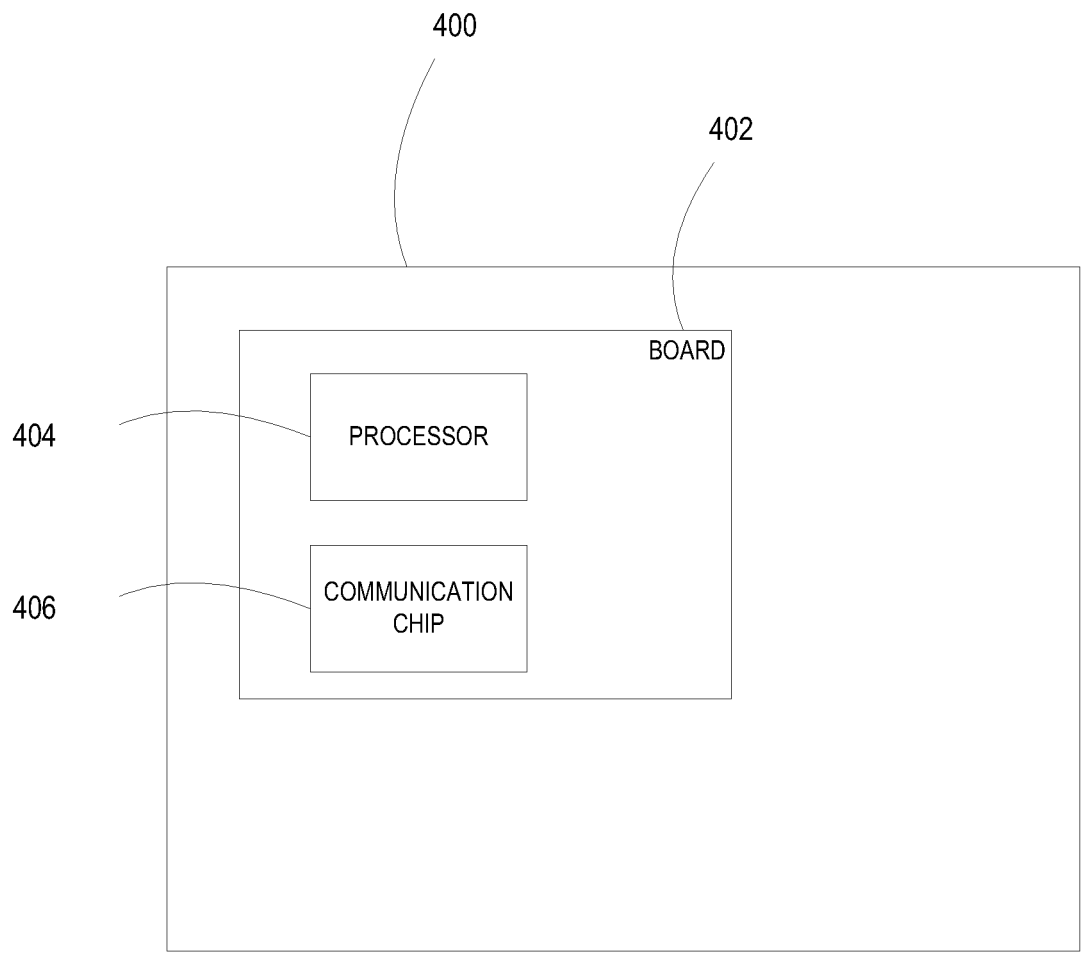
FIG. 29 represents a computing device in accordance with embodiments of the invention.

FIG. 29 illustrates a computing device 400 in accordance with one embodiment of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be included in or may include one or more integrated circuit packages, such as chip 160 or 3D package of FIG. 27 for example. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be included in or may include one or more integrated circuit packages, such as chip 160 or 3D package of FIG. 27 for example.

In further implementations, another component housed within the computing device 400 may contain an integrated circuit package, such as chip 160 or 3D package of FIG. 27 for example. In addition, the processor 404, communication chip 406 and other components housed within the computing device 400 may be stacked in a 3D package of FIG. 27 for example.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A 3D interconnect structure comprising:
   a semiconductor substrate having a front surface and a back surface opposite the front surface;
   a metallization structure over the front surface, the metallization structure comprising multiple interconnect layers and interlayer dielectric layers;
   a via extending through the semiconductor substrate between the front and back surfaces; and
   a single damascene redistribution layer (RDL) formed over the back surface.

2. The 3D interconnect structure of claim 1, further comprising a passivation layer disposed between the back surface and the RDL.

3. The 3D interconnect structure of claim 2, wherein the passivation layer comprises silicon carbide or silicon nitride.

4. The 3D interconnect structure of claim 3, wherein the via further comprises:
   an insulating liner layer formed on side surfaces of a via opening in the semiconductor substrate;
   a continuous barrier layer formed on a bottom surface of the via opening, and on the insulating liner layer formed on the side surfaces of the via opening; and
   a conductive metal filling a bulk volume of the via opening.

5. The 3D interconnect structure of claim 4, wherein the single damascene RDL further comprises:
   a barrier layer formed on side surfaces of a trench opening in a dielectric layer, wherein the trench opening exposes the passivation layer and the via; and
   a conductive metal filling a bulk volume of the trench opening.

6. The 3D interconnect structure of claim 3, further comprising:
   an array of landing pads arranged over the back surface in a series of rows and columns;
   an array of through-silicon vias (TSVs) arranged under the back surface such that the array of TSVs is not directly underneath the array of landing pads; and
   a plurality of RDLs running between two of the rows of the landing pads connecting one of the two rows to a corresponding number of TSVs in the array of TSVs.

7. The 3D interconnect structure of claim 6, wherein the two rows of the landing pads are separated by a pitch of 10 µm to 500 µm.

8. A 3D package comprising:
   a base substrate; and
   a chip stack formed over the base substrate;
   wherein the chip stack includes a chip comprising:
      a semiconductor substrate having a front surface and a back surface;
      a via extending between the front and back surfaces of the semiconductor substrate; and
      a single damascene redistribution layer (RDL) formed over the back surface.

9. The 3D package of claim 8, wherein the chip is a logic chip.

10. The 3D package of claim 9, further comprising a system comprising a bus communicatively coupled to the 3D package.

11. The 3D package of claim 9, wherein the logic chip further comprises:
    an array of landing pads arranged over the back surface in a series of rows and columns;
    an array of through-silicon vias (TSVs) arranged under the back surface such that the array of TSVs is not directly underneath the array of landing pads; and
    a plurality of RDLs running between two of the rows of the landing pads connecting one of the two rows to a corresponding number of TSVs in the array of TSVs.

12. The 3D package of claim 11, wherein the array of landing pads are coupled with a corresponding array of landing pads of a memory chip.

13. A method of forming a 3D interconnect structure comprising:
    forming an etch stop layer over a back surface of a device wafer having a via extending from the back surface to a front surface of the device wafer
    forming a dielectric layer over the etch stop layer;
    forming a trench opening in the dielectric layer and etch stop layer to expose the via;
    filling a bulk volume of the trench opening with a conductive metal to form a redistribution layer (RDL) including a landing pad, wherein the via is not directly underneath the landing pad; and
    forming a conductive bump over the landing pad.

14. The method of claim 13, prior to forming the etch stop layer:
    forming a passivation layer over the back surface of the device wafer, wherein the passivation layer comprises silicon carbide or silicon nitride;
    forming a via opening in the device wafer between the back surface and a front surface of the device wafer;
    forming a barrier layer within the via opening and over the passivation layer;
    filling a bulk volume of the via opening with a conductive metal;
    removing an overburden of the conductive metal and the barrier layer from over the passivation layer to form the via.

15. The method of claim 14, further comprising depositing an insulating liner layer on side and bottom surfaces of the via opening.

16. The method of claim 15, further comprising anisotropically etching the insulating liner layer from the bottom surface of the via opening while retaining a substantial thickness on the side surfaces of the via opening.

17. The method of claim 16, wherein filling the bulk volume of the via opening with a conductive metal comprises electroplating copper.

18. The method of claim 13, wherein forming the trench opening comprises using a patterned photoresist layer as a mask, and etching the etch stop layer with a plasma etch chemistry which is selective to the etch stop layer while not substantially etching the dielectric layer and an insulating liner layer.

19. The method of claim 13, further comprising:
    forming an array of landing pads over the back surface in a series of rows and columns;
    forming an array of through-silicon vias (TSVs) under the back surface such that the array of TSVs is not directly underneath the array of landing pads; and
    forming a plurality of RDLs running between two of the rows of the landing pads connecting one of the two rows to a corresponding number of TSVs in the array of TSVs.

20. The method of claim 19, wherein the two rows of the landing pads are separated by a pitch of 10 µm to 500 µm.

21. A 3D interconnect structure comprising:
    a semiconductor substrate having a front surface and a back surface;
    a via extending through the semiconductor substrate between the front and back surfaces;

a single damascene redistribution layer (RDL) formed over the back surface;
a passivation layer disposed between the back surface and the RDL, the back surface comprising silicon carbide or silicon nitride;
an array of landing pads arranged over the back surface in a series of rows and columns;
an array of through-silicon vias (TSVs) arranged under the back surface such that the array of TSVs is not directly underneath the array of landing pads; and
a plurality of RDLs running between two of the rows of the landing pads connecting one of the two rows to a corresponding number of TSVs in the array of TSVs.

22. The 3D interconnect structure of claim 21, wherein the two rows of the landing pads are separated by a pitch of 10 μm to 500 μm.

* * * * *